(12) United States Patent
Komai

(10) Patent No.: US 12,119,366 B2
(45) Date of Patent: Oct. 15, 2024

(54) SOLID STATE IMAGING DEVICE, SOLID STATE IMAGING DEVICE MANUFACTURING METHOD, AND ELECTRONIC APPARATUS

(71) Applicant: SONY SEMICONDUCTOR SOLUTIONS CORPORATION, Kanagawa (JP)

(72) Inventor: Naoki Komai, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/329,454

(22) PCT Filed: Aug. 25, 2017

(86) PCT No.: PCT/JP2017/030463
§ 371 (c)(1),
(2) Date: Feb. 28, 2019

(87) PCT Pub. No.: WO2018/047635
PCT Pub. Date: Mar. 15, 2018

(65) Prior Publication Data
US 2019/0221602 A1    Jul. 18, 2019

(30) Foreign Application Priority Data
Sep. 9, 2016   (JP) .................. 2016-176214

(51) Int. Cl.
*H01L 27/146*   (2006.01)
*H04N 25/79*   (2023.01)
*H04N 25/11*   (2023.01)

(52) U.S. Cl.
CPC .. *H01L 27/14645* (2013.01); *H01L 27/14621* (2013.01); *H01L 27/14627* (2013.01);
(Continued)

(58) Field of Classification Search
CPC ...................... H01L 27/1464; H01L 27/14636
See application file for complete search history.

(56) References Cited

U.S. PATENT DOCUMENTS

| 2009/0280596 A1 | 11/2009 | Akiyama |
| 2010/0117181 A1 | 5/2010 | Kim |

(Continued)

FOREIGN PATENT DOCUMENTS

| CN | 101088165 A | 12/2007 |
| CN | 101656820 A | 2/2010 |

(Continued)

OTHER PUBLICATIONS

International Search Report prepared by the Japan Patent Office on Nov. 7, 2017, for International Application No. PCT/JP2017/030463.

*Primary Examiner* — Tucker J Wright
(74) *Attorney, Agent, or Firm* — SHERIDAN ROSS P.C.

(57) ABSTRACT

The present disclosure relates to a solid state imaging device capable of further decreasing a chip size, a solid state imaging device manufacturing method, and an electronic apparatus. A solid state imaging device includes: a semiconductor substrate with a pixel region on which a plurality of pixels is arranged in a planar manner; a wiring layer that is laminated on the semiconductor substrate and is provided with wiring connected to the plurality of pixels; and a support substrate that is bonded to the wiring layer. A plurality of electrode pads used to be electrically connected to an outside is arranged at positions overlapping the pixel region in the wiring layer, and through-holes are provided at positions corresponding to the plurality of electrode pads in the support substrate. The present technology can be applied to, for example, a back side irradiation type CMOS image sensor of a wafer level CSP.

19 Claims, 30 Drawing Sheets

(52) U.S. Cl.
CPC .. *H01L 27/14634* (2013.01); *H01L 27/14636* (2013.01); *H01L 27/1464* (2013.01); *H01L 27/14683* (2013.01); *H01L 27/1469* (2013.01); *H04N 25/79* (2023.01); *H01L 27/14623* (2013.01); *H04N 25/11* (2023.01)

(56) References Cited

U.S. PATENT DOCUMENTS

| | | |
|---|---|---|
| 2010/0200898 A1 | 8/2010 | Lin |
| 2011/0121420 A1* | 5/2011 | Yang ................ H01L 27/14634 257/432 |
| 2011/0304008 A1 | 12/2011 | Yang |
| 2018/0152657 A1* | 5/2018 | Miyazawa ............. H04N 5/341 |

FOREIGN PATENT DOCUMENTS

| | | |
|---|---|---|
| CN | 102760743 A | 10/2012 |
| CN | 105378928 A | 3/2016 |
| DE | 102012220416 A1 | 5/2014 |
| JP | 2009-158862 | 7/2009 |
| JP | 2009-277732 | 11/2009 |
| JP | 2010050149 A | 3/2010 |
| JP | 2010199589 A | 9/2010 |
| JP | 2010-273757 | 12/2010 |
| JP | 2011146445 A | 7/2011 |
| JP | 2012118060 A | 6/2012 |
| JP | 2014-099436 | 5/2014 |
| JP | 2015-126187 | 7/2015 |
| JP | 2015135938 A | 7/2015 |
| KR | 20100097073 A | 9/2010 |
| KR | 20110055980 A | 5/2011 |

* cited by examiner

FIG. 4
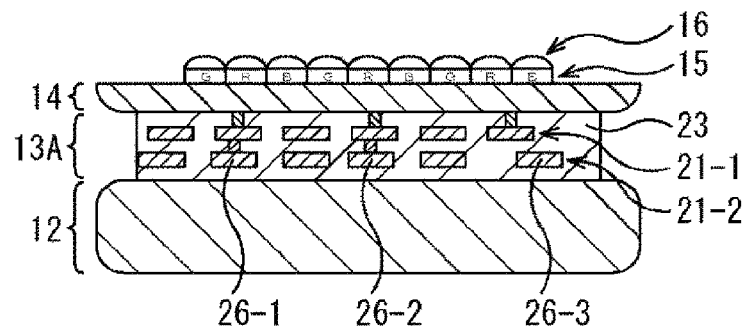
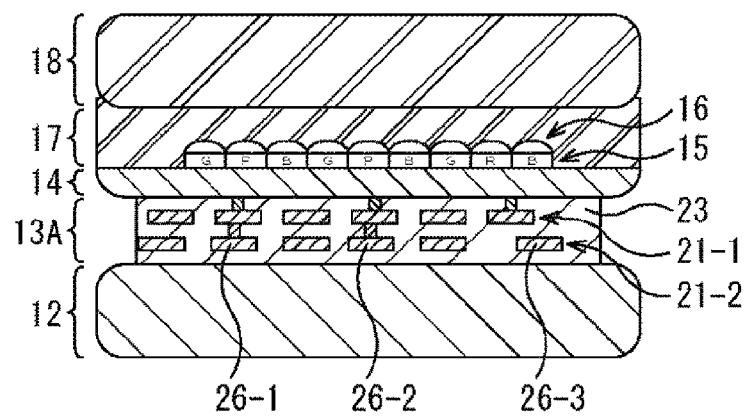
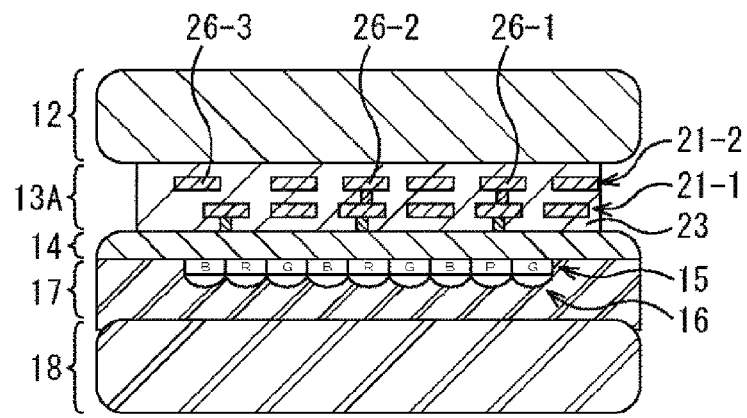

FIG. 9
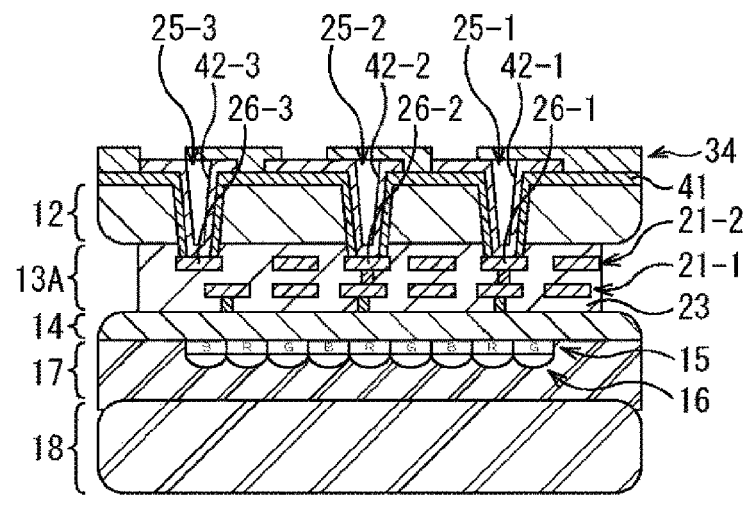
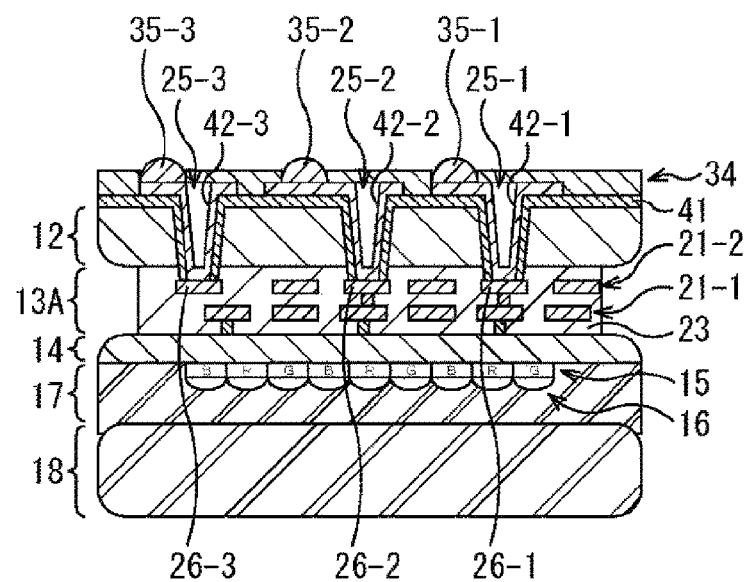

FIG. 14
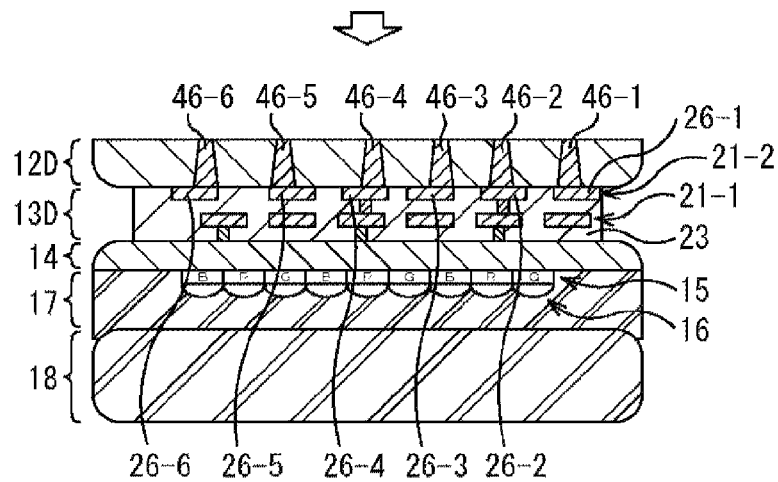
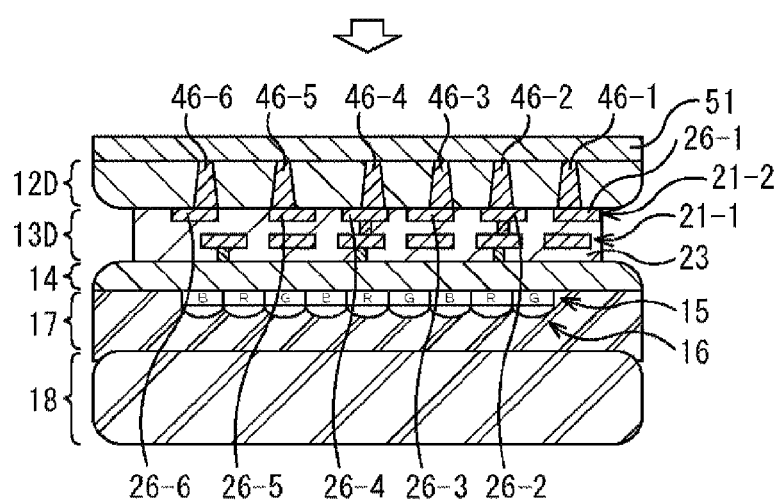
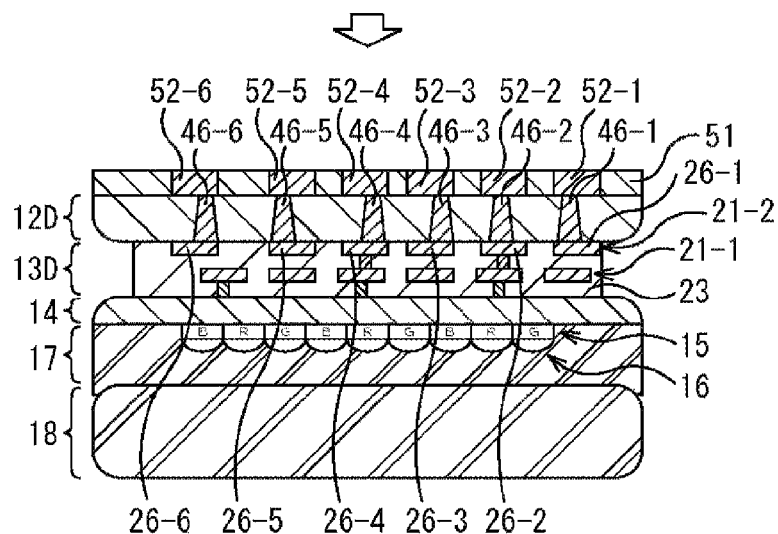

FIG. 15
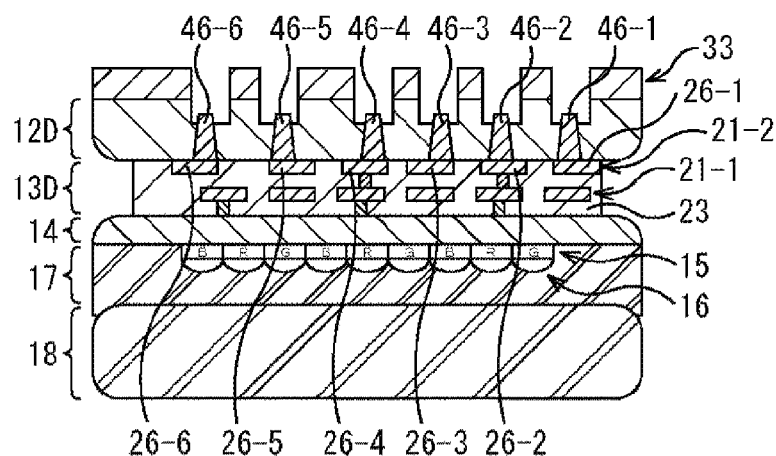
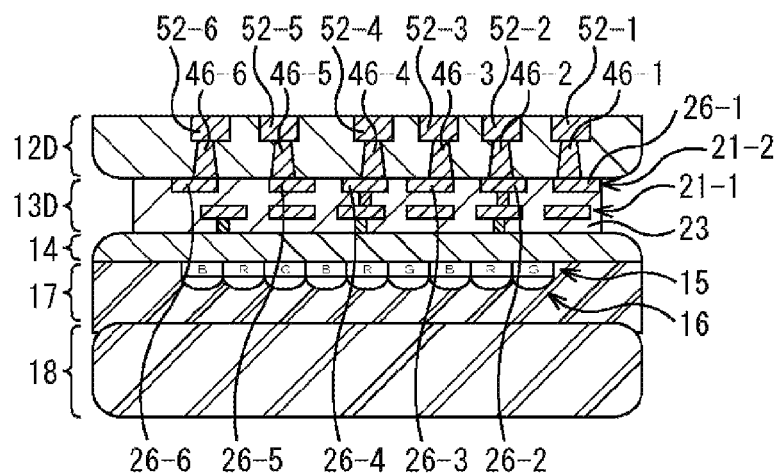

FIG. 22
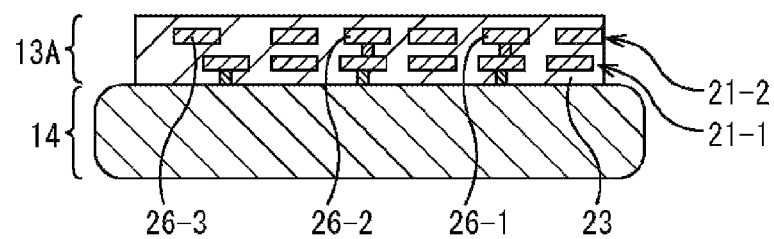
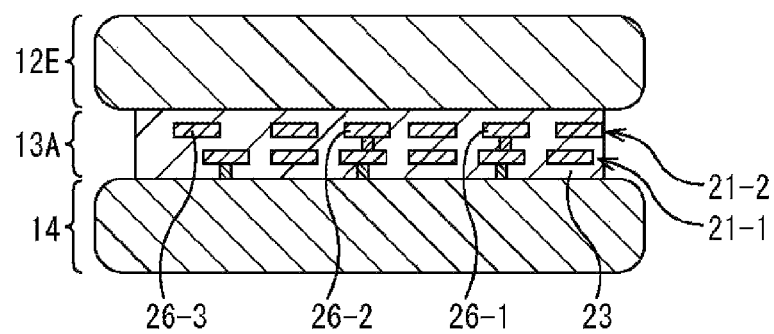
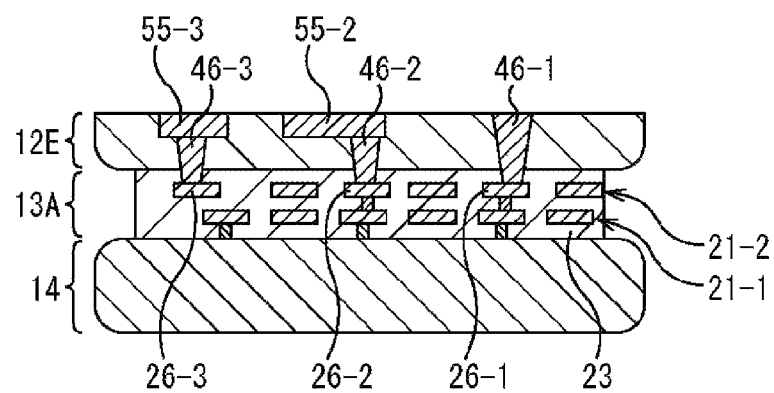

SOLID STATE IMAGING DEVICE, SOLID STATE IMAGING DEVICE MANUFACTURING METHOD, AND ELECTRONIC APPARATUS

CROSS REFERENCE TO RELATED APPLICATIONS

This application is a national stage application under 35 U.S.C. 371 and claims the benefit of PCT Application No. PCT/JP2017/030463 having an international filing date of 25 Aug. 2017, which designated the United States, which PCT application claimed the benefit of Japanese Patent Application No. 2016-176214 filed 9 Sep. 2016, the entire disclosures of each of which are incorporated herein by reference.

TECHNICAL FIELD

The present disclosure relates to a solid state imaging device, a solid state imaging device manufacturing method, and an electronic apparatus and particularly to a solid state imaging device capable of further decreasing a chip size, a solid state imaging device manufacturing method, and an electronic apparatus.

BACKGROUND ART

Conventionally, in an electronic apparatus having an imaging function such as a digital still camera or a digital video camera, for example, a solid state imaging device such as a charge coupled device (CCD) or a complementary metal oxide semiconductor (CMOS) image sensor is used. The solid state imaging device has a pixel in which a photodiode that performs photoelectric conversion and a plurality of transistors are combined and an image is constructed on the basis of pixel signals output from a plurality of pixels arranged on an image plane on which an image of a subject is formed.

Further, as a structure of the solid state imaging device, a front side irradiation type in which light is irradiated to a front surface of a semiconductor substrate on which a photodiode is formed and a back side irradiation type in which light is irradiated to a back surface of a semiconductor substrate on which a photodiode is formed is known. In the back surface irradiation type solid state imaging device, the photodiode can receive more light because of a structure in which a wiring layer is provided on the opposite side of the light receiving surface.

Further, as a method of mounting the solid state imaging device, for example, a wire bonding method in which an electrode pad is provided at the outside of a pixel region of a semiconductor substrate and is electrically connected to the outside, a flip chip bonding method in which an electrode pad is electrically connected to the outside by using a solder ball, or the like is known.

For example, Patent Document 1 discloses a solid state imaging device having a structure in which glass is adhered to a light receiving surface of a semiconductor substrate provided with a color filter and an on-chip lens, a through-hole is formed from a back surface side of the semiconductor substrate toward an electrode pad, a rewiring is formed on the opposite side of the light receiving surface from the electrode pad, and a solder ball is mounted on the substrate surface.

CITATION LIST

Patent Document

Patent Document 1: Japanese Patent Application Laid-Open No. 2009-158862

SUMMARY OF THE INVENTION

Problems to be Solved by the Invention

Incidentally, in a case where drawn electrodes are formed on the back surface in the front side irradiation type solid state imagine apparatus, it is necessary to form electrodes to the wiring layer so that the electrode penetrates the semiconductor substrate. Thus, in this case, a configuration is obtained in which the electrode pad is disposed at a position except for the pixel region of the solid state imaging apparatus and the through-hole is formed from the rear surface side to the electrode pad so that the through-hole penetrates the semiconductor substrate.

However, in such a configuration, since the electrode pad is formed at the outside of the pixel region, the chip size increases by the area necessary for arranging the electrode pads as many as the external connection positions. For that reason, in a method in which the electrode is drawn to the back surface and is mounted, the chip size of the solid state imaging device can be decreased as compared with a method in which the electrode is drawn and mounted by wire bonding, but it is difficult to greatly decrease the chip size of the solid state imaging device.

The present disclosure has been made in view of such circumstances and an object thereof is to further decrease a chip size.

Solutions to Problems

A solid state imaging device according to an aspect of the present disclosure includes: a semiconductor substrate that is provided with a pixel region on which a plurality of pixels is arranged in a planar manner; a wiring layer that is laminated on the semiconductor substrate and is provided with wiring connected to the plurality of pixels; and a support substrate that is bonded to the wiring layer and supports the semiconductor substrate, in which a plurality of electrode pads used to be electrically connected to an outside is arranged at positions overlapping the pixel region in the wiring layer when the semiconductor substrate is viewed in a planar manner, and through-holes are provided at positions corresponding to the plurality of electrode pads in the support substrate.

A method of manufacturing according to an aspect of the present disclosure is a method of manufacturing a solid state imaging device including a semiconductor substrate that is provided with a pixel region on which a plurality of pixels is arranged in a planar manner, a wiring layer that is laminated on the semiconductor substrate and is provided with wiring connected to the plurality of pixels, and a support substrate that is bonded to the wiring layer and supports the semiconductor substrate, the method including steps of: forming a plurality of electrode pads used to be electrically connected to an outside at positions overlapping the pixel region in the wiring layer when the semiconductor substrate is viewed in a planar manner; and forming through-holes at positions corresponding to the plurality of electrode pads in the support substrate.

An electronic apparatus according to an aspect of the present disclosure includes: a solid state imaging device including: a semiconductor substrate that is provided with a pixel region on which a plurality of pixels is arranged in a planar manner; a wiring layer that is laminated on the semiconductor substrate and is provided with wiring connected to the plurality of pixels; and a support substrate that is bonded to the wiring layer and supports the semiconductor substrate, in which a plurality of electrode pads used to be electrically connected to an outside is arranged at positions overlapping the pixel region in the wiring layer when the semiconductor substrate is viewed in a planar manner, and through-holes are provided at positions corresponding to the plurality of electrode pads in the support substrate.

In an aspect of the present disclosure, a plurality of electrode pads used to be electrically connected to the outside are arranged at positions overlapping a pixel region in a wiring layer when a semiconductor substrate is viewed in a planar manner and through-holes are provided at positions corresponding to the plurality of electrode pads in the support substrate.

Effects of the Invention

According to an aspect of the present disclosure, it is possible to further decrease a chip size.

BRIEF DESCRIPTION OF DRAWINGS

FIG. 4 is a diagram illustrating a first method of manufacturing the imaging device.

FIG. 9 is a diagram illustrating a modified example of the imaging device of FIG. 3.

FIG. 14 is a diagram illustrating the third method of manufacturing the imaging device.

FIG. 15 is a diagram illustrating a first modified example of the third method of manufacturing the imaging device.

FIG. 22 is a diagram illustrating a fourth method of manufacturing the imaging device.

MODE FOR CARRYING OUT THE INVENTION

Hereinafter, detailed embodiments that adopt the present technology will be described in detail with reference to the drawings.

First Configuration Example of Imaging Device

Figure 1:
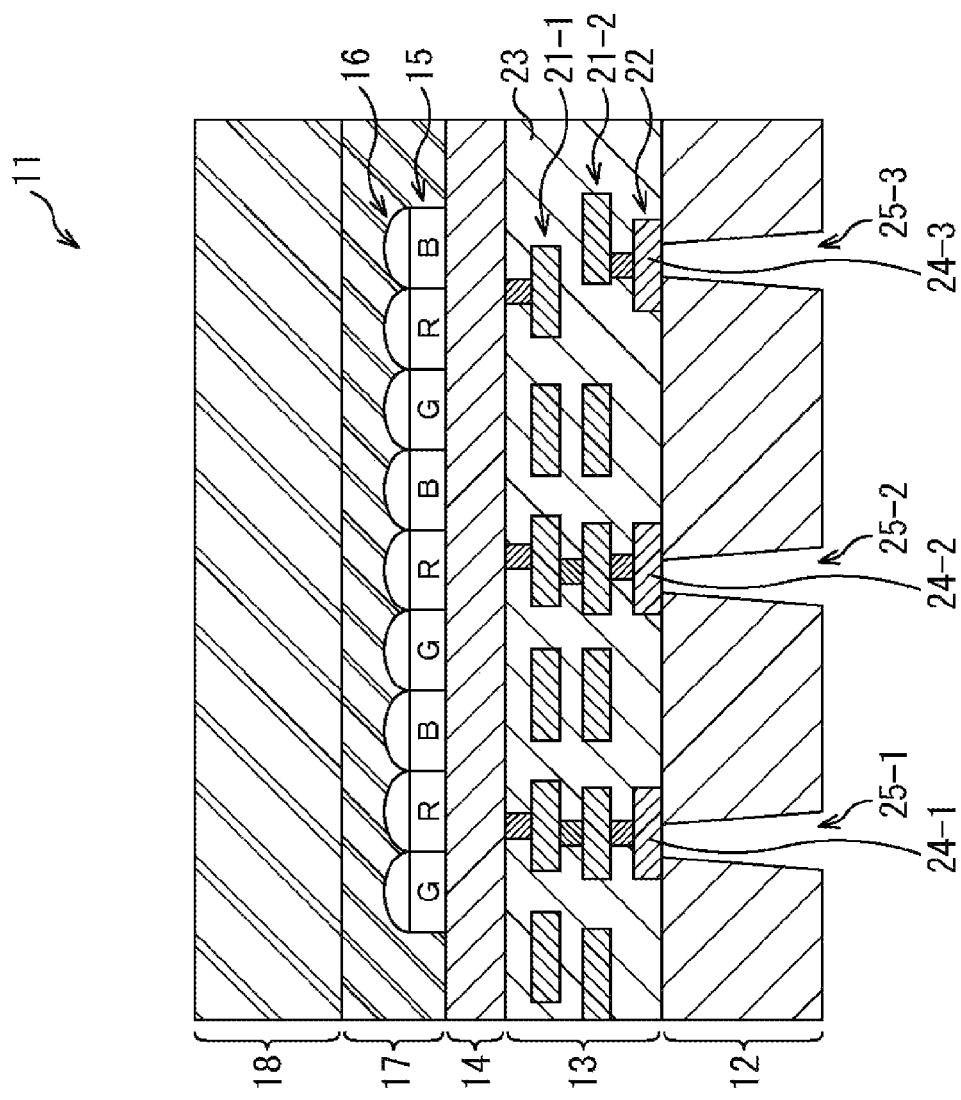
FIG. 1 is a diagram showing a configuration example of a first embodiment of an imaging device that adopts the present technology.

FIG. 1 is a diagram showing a configuration example of a first embodiment of an imaging device that adopts the present technology.

FIG. 1 shows a schematic cross-sectional configuration of an imaging device 11. The imaging device 11 is formed by sequentially laminating a support substrate 12, a multi-layer wiring layer 13, a semiconductor substrate 14, a color filter layer 15, an on-chip lens layer 16, a glass sealing resin layer 17, and a glass protective substrate 18 from below in FIG. 1. For example, the imaging device 11 is a backside illumination type solid state imaging device which irradiates light to a pixel formed on the semiconductor substrate 14 from a back side of the semiconductor substrate 14 (the upper side of FIG. 1).

The support substrate 12 is a substrate which supports the semiconductor substrate 14 which is thinned to receive light irradiated from the back surface side by the pixel.

The multi-layer wiring layer 13 is a wiring layer in which wiring connected to the pixel formed on the semiconductor substrate 14 has a multi-layer structure. In the example of FIG. 1, the multi-layer wiring layer 13 has a two-layer structure in which a first wiring layer 21-1 and a second wiring layer 21-2 are laminated from the side of the semiconductor substrate 14 and the wiring constituting the layers is formed by, for example, a conductive connection conductor such as copper. Further, in the multi-layer wiring layer 13, an electrode pad layer 22 is provided on the side of the support substrate 12 in relation to the first wiring layer 21-1 and the second wiring layer 21-2. Then, in the multi-layer wiring layer 13, the first wiring layer 21-1, the second wiring layer 21-2, the electrode pad layer 22, and the through-electrodes connecting the respective layers are insulated by an interlayer insulation film 23.

Further, a plurality of electrode pads 24 constituting the electrode pad layer 22 is formed by, for example, a conductive connection conductor such as aluminum and the support substrate 12 at each corresponding position is provided with a through-hole 25 formed to penetrate the support substrate 12. Accordingly, the electrode pad 24 is opened by the through-hole 25 and is usable to be electrically connected to the outside of the imaging device 11. In the example of FIG. 1, three electrode pads 24-1 to 24-3 are disposed on the electrode pad layer 22 and three through-holes 25-1 to 25-3 respectively corresponding to the electrode pads 24-1 to 24-3 are formed on the support substrate 12.

The semiconductor substrate 14 is, for example, a wafer which is formed by thinning a material such as single crystal silicon. A plurality of pixels is arranged on the semiconductor substrate 14 in a matrix shape.

The color filter layer 15 is formed by arranging a filter, transmitting light of color (for example, three primary colors of red, green, and blue) received by each pixel, for each of a plurality of pixels arranged on the semiconductor substrate 14 in a planar manner. The on-chip lens layer 16 is formed by arranging a micro lens, collecting light to each pixel, for each of a plurality of pixels arranged on the semiconductor substrate 14 in a planar manner.

The glass sealing resin layer 17 is a layer which includes a transparent resin for bonding the glass protective substrate 18 to the semiconductor substrate 14 in a cavity-less manner. The glass protective substrate 18 is a substrate which is formed by a transparent glass for protecting a light receiving surface of the imaging device 11.

In the imaging device 11 with such a configuration, the electrode pad 24 is formed right below a pixel region in which a pixel is formed on the semiconductor substrate 14 to overlap the pixel region when the imaging device 11 is viewed in a planar manner.

Figure 2:
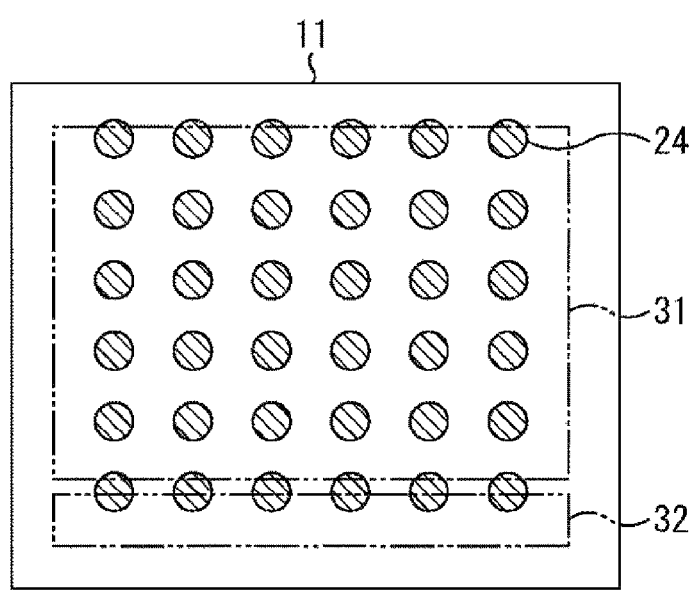
FIG. 2 is a diagram showing a configuration example when the imaging device is viewed in a planar manner.

Here, FIG. 2 shows a schematic configuration when the imaging device 11 is viewed from a side of the support substrate 12.

As shown in FIG. 2, when the imaging device 11 is viewed in a planar manner, almost the entire range of the center is formed as a pixel region 31 and an optical black region 32 is formed at the side of the pixel region 31.

The pixel region 31 is a region provided with a pixel outputting a pixel signal constituting an image photographed by the imaging device 11 in the semiconductor substrate 14 and a plurality of pixels are arranged on the pixel region 31 in a planar manner. The optical black region 32 is a region which is optically shielded and in which a pixel outputting a pixel signal used as a black reference when constructing an image photographed by the imaging device 11.

Then, in the imaging device 11, as shown in the drawings, the plurality of electrode pads 24 are arranged in a grid shape at a position overlapping the pixel region 31. In this way, since the plurality of electrode pads 24 is arranged to overlap the pixel region 31 when viewed in a planar manner, the imaging device 11 can decrease the chip size.

For example, in the conventional imaging device, since the electrode pad is disposed outside the pixel region so as not to overlap the pixel region when viewed in a planar manner, it is necessary to design the chip size to be large by the area necessary for forming the electrode pad at the outside of the pixel region.

In contrast, in the imaging device 11, since the electrode pad 24 including aluminum is provided on the side of the support substrate 12 of the multi-layer wiring layer 13 and the through-hole 25 is formed to open to the electrode pad 24 as shown in FIG. 1, the electrode pad 24 can be disposed right below the pixel region 31. Accordingly, the imaging device 11 can decrease the ship size as compared with the related art without giving a bad influence on the pixel disposed on the pixel region 31, that is, without giving a bad influence on an image photographed by the imaging device 11.

That is, the imaging device 11 can be decreased in size as compared with, for example, the imaging device having the same viewing angle since the wiring can be drawn to a position right below the pixel region 31 as compared with a configuration in which the wiring is drawn in the lateral direction of the pixel region 31. Further, since the wiring of the imaging device 11 can be shortened, it is possible to stabilize a power supply and to reduce power consumption. Further, since the imaging device 11 can be mounted to other substrates having a different chip size (for example, a logic circuit board 62 which will be described below in FIG. 28) at a position right below the pixel, a higher function can be obtained without increasing the chip size.

Further, in the example shown in FIG. 2, almost all electrode pads 24 are arranged at positions overlapping the pixel region 31, but for example, a part of the electrode pads 24 may be arranged at the outside of the pixel region 31. That is, in the plurality of electrode pads 24, since at least a part of the electrode pads 24 are arranged at positions overlapping the pixel region 31, the chip size of the imaging device 11 can be decreased.

Furthermore, in the imaging device 11 shown in FIG. 1, the electrode pad 24 includes aluminum differently from the wiring constituting the second wiring layer and the first wiring layer 21-1. In contrast, for example, the electrode pad of the imaging device 11 may include copper which is the same as that of the wiring constituting the second wiring layer and the first wiring layer 21-1.

Second Configuration Example of Imaging Device

Figure 3:
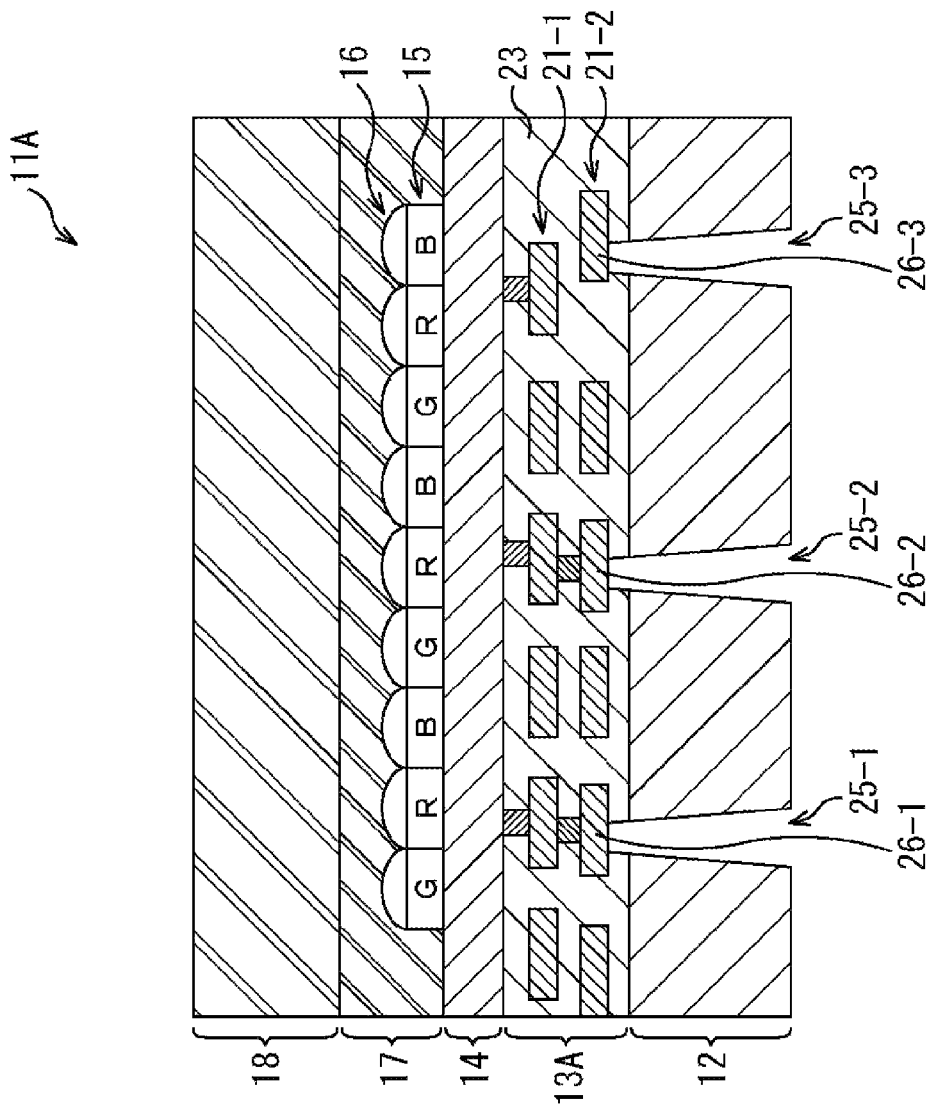
FIG. 3 is a diagram showing a configuration example of a second embodiment of the imaging device.

FIG. 3 is a cross-sectional view showing a second configuration example of the imaging device 11. Furthermore, in an imaging device 11A shown in FIG. 3, the same reference numerals will be given to the configurations common to the imaging device 11 of FIG. 1 and a detailed description thereof will be omitted.

As shown in FIG. 3, the imaging device 11A is formed by sequentially laminating the support substrate 12, a multi-layer wiring layer 13A, the semiconductor substrate 14, the color filter layer 15, the on-chip lens layer 16, the glass sealing resin layer 17, and the glass protective substrate 18 from below in FIG. 3.

The multi-layer wiring layer 13A is provided with the first wiring layer 21-1 and the second wiring layer 21-2 and is not provided with the electrode pad layer 22 shown in FIG. 1. Then, in the multi-layer wiring layer 13A, electrode pads 26-1 to 26-3 are arranged on a part of the second wiring layer 21-2. For example, the electrode pads 26-1 to 26-3 can be formed by patterning the wiring constituting the second wiring layer 21-2 and include copper which is the same as that of the second wiring layer 21-2.

Further, in the imaging device 11A, similarly to the imaging device 11 of FIG. 1, through-holes 25-1 to 25-3 are formed to penetrate the support substrate 12 so that the electrode pads 26-1 to 26-3 are opened. Then, the electrode pads 26 are arranged in a grid shape at positions overlapping the pixel region 31 similarly to the electrode pads 24 shown in FIG. 2.

In this way, in the imaging device 11A, for example, a part of the wiring layer 21 closest to the support substrate 12 is used as the electrode pad 26 without providing the electrode pad layer 22 (FIG. 1) used to be electrically connected to the outside on the multi-layer wiring layer 13A. Furthermore, for example, in the wiring layer 21 which is laminated on the multi-layer wiring layer 13A in a multi-layer structure, a part of the wiring layer 21 other than the wiring layer 21 closest to the support substrate 12 may be used as the electrode pad 26. In this case, the through-hole 25 is formed to be opened to the electrode pad 26.

In the imaging device 11A with such a configuration, similarly to the imaging device 11 of FIG. 1, the chip size can be decreased as compared with the related art by a structure in which the electrode pad 26 is disposed at a position right below the pixel region 31 (FIG. 2) of the semiconductor substrate 14.

First Method of Manufacturing Imaging Device

A method of manufacturing the imaging device 11A of FIG. 3 will be described with reference to FIGS. 4 and 5.

First, in a first step, the multi-layer wiring layer 13A is laminated on a front surface of the semiconductor substrate 14 and the support substrate 12 is adhered thereto from the upper side of the semiconductor substrate 14 with the multi-layer wiring layer 13A interposed therebetween. Here, the plurality of electrode pads 26 which are formed on the multi-layer wiring layer 13A are formed to overlap the pixel region 31 with an arrangement in which the electrode pads are located right above the pixel region 31 (FIG. 2) of the semiconductor substrate 14 at the time of manufacturing the imaging device. Then, the intermediate structure including the support substrate 12, the multi-layer wiring layer 13A, and the semiconductor substrate 14 is inverted to thin the semiconductor substrate 14 from the back surface side. Then, as shown in the first stage of FIG. 4, the color filter layer 15 and the on-chip lens layer 16 are laminated on the back surface of the semiconductor substrate 14.

In a second step, an adhesive which becomes the glass sealing resin layer 17 is applied to the entire back surface of the semiconductor substrate 14 by including the on-chip lens layer 16 so that the glass protective substrate 18 is adhered thereto. Accordingly, as shown in the second stage of FIG. 4, the glass protective substrate 18 and the semiconductor substrate 14 are bonded in a cavity-less structure through the glass sealing resin layer 17.

In a third step, as shown in the third stage of FIG. 4, the intermediate structure including the support substrate 12, the multi-layer wiring layer 13A, the semiconductor substrate 14, the color filter layer 15, the on-chip lens layer 16, the glass sealing resin layer 17, and the glass protective substrate 18 is inverted.

Figure 5:
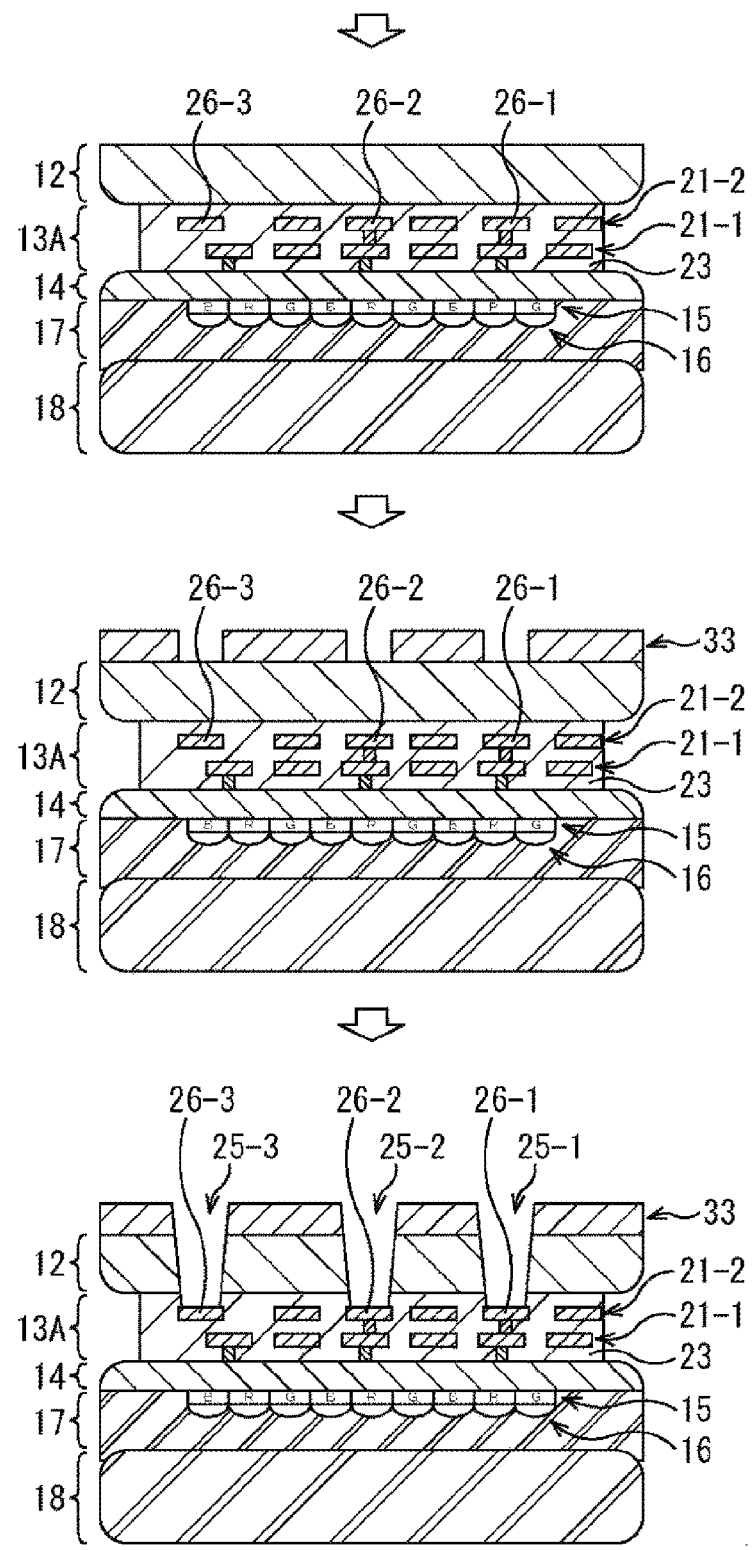
FIG. 5 is a diagram illustrating the first method of manufacturing the imaging device.

In a fourth step, as shown in the first stage of FIG. 5, for example, the support substrate 12 is thinned to about 100 μm by using a back grinding technology such as grinding and polishing.

In a fifth step, as shown in the second stage of FIG. 5, a resist pattern 33 is formed on the support substrate 12. For example, the resist pattern 33 is formed by forming a resist film on the entire surface of the support substrate 12 and patterning the resist film so that positions corresponding to the electrode pads 26-1 to 26-3 are opened.

In a sixth step, the support substrate 12 is processed by using, for example, a dry etching method or the like so that a hole is formed at a position corresponding to each of the electrode pads 26-1 to 26-3 to penetrate the support substrate 12 to the multi-layer wiring layer 13A. Then, a part of the interlayer insulation film 23 of the multi-layer wiring layer 13A is removed by using the support substrate 12 as a mask so that the through-holes 25-1 to 25-3 are formed to the electrode pads 26-1 to 26-3 by penetrating as shown in the third stage of FIG. 5.

Then, the imaging device 11A shown in FIG. 3 is manufactured by removing the resist pattern 33 to be cut into a prescribed external shape.

As described above, the imaging device 11A can be manufactured by a manufacturing method of laminating the color filter layer 15 and the on-chip lens layer 16 on the light receiving surface side of the semiconductor substrate 14 and then forming the through-hole 25 in the support substrate 12.

Furthermore, for example, a method of forming the electrode pads 26-1 to 26-3 on the multi-layer wiring layer 13A existing between the semiconductor substrate 14 and the support substrate 12 is described in detail by the paragraphs 15 to 21 of Japanese Patent Application Laid-Open No. 2009-277732. Similarly, for example, a method of forming the color filter layer 15 and the on-chip lens layer 16 in the back side irradiation type imaging device 11A is also described in detail by the paragraphs 22 to 30 of Japanese Patent Application Laid-Open No. 2009-277732.

Third Configuration Example of Imaging Device

Figure 6:
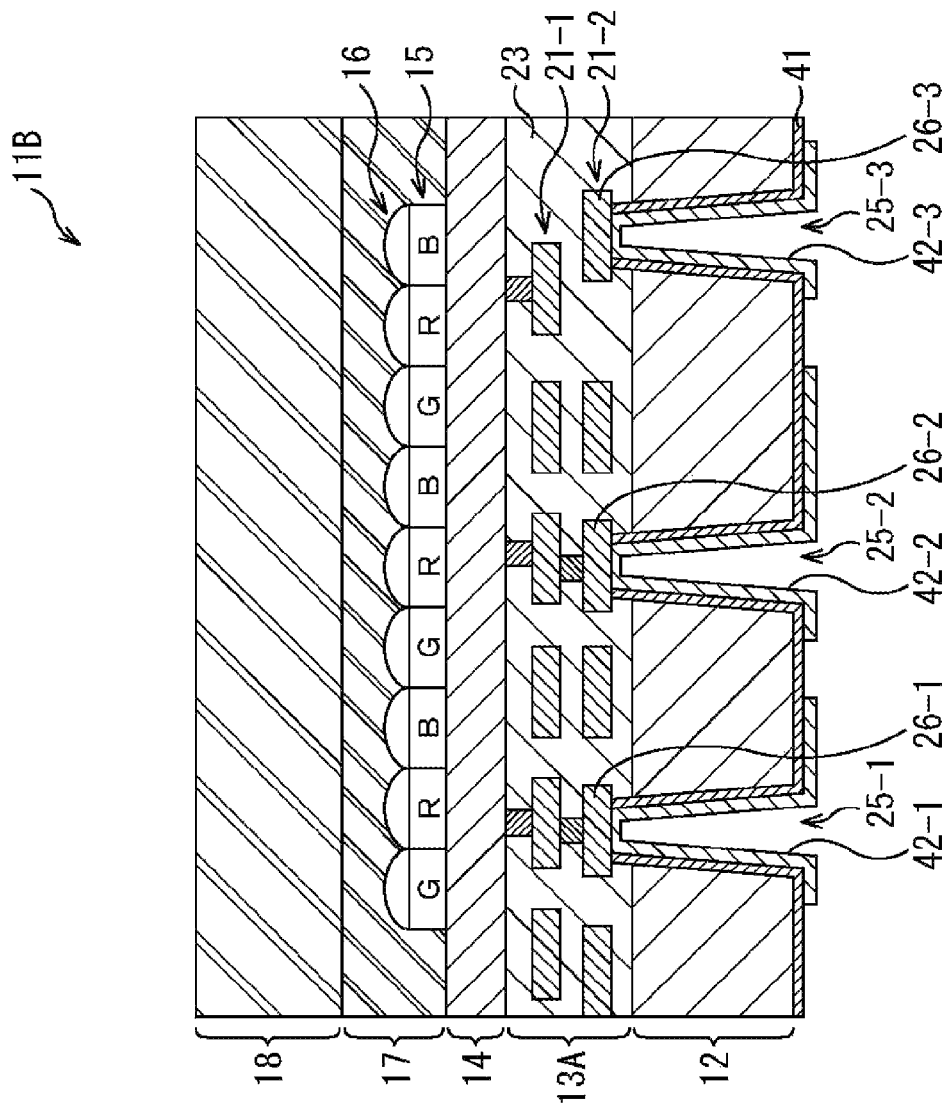
FIG. 6 is a diagram illustrating a configuration example of a third embodiment of the imaging device.

FIG. 6 is a cross-sectional view showing a third configuration example of the imaging device 11. Furthermore, in an imaging device 11B shown in FIG. 6, the same reference numerals will be given to the configurations common to the imaging device 11A of FIG. 3 and a detailed description thereof will be omitted.

As shown in FIG. 6, the imaging device 11B is formed by laminating the support substrate 12, the multi-layer wiring layer 13A, the semiconductor substrate 14, the color filter layer 15, the on-chip lens layer 16, the glass sealing resin layer 17, and the glass protective substrate 18 similarly to the imaging device 11A of FIG. 3. Further, in the imaging device 11B, similarly to the imaging device 11A of FIG. 3, the electrode pads 26-1 to 26-3 are disposed on the multi-layer wiring layer 13A and the through-holes 25-1 to 25-3 are formed in the support substrate 12 so that the electrode pads 26-1 to 26-3 are opened.

Then, in the imaging device 11B, an insulation film 41 is formed on the entirety of the side surface of the through-hole 25 and the upper surface of the support substrate 12 and through-electrodes 42-1 to 42-3 are provided to be insulated from the support substrate 12 by the insulation film 41 and to be electrically connected to the electrode pads 26-1 to 26-3.

The insulation film 41 is formed by, for example, an SiO2 film, SiN film, or the like having an insulation property and insulates the support substrate 12 from the through-electrodes 42-1 to 42-3.

The through-electrode 42 is electrically connected to the electrode pads 26-1 to 26-3 at a bottom surface portion of the through-hole 25 and is formed to extend to the upper surface of the support substrate 12 through the through-hole 25. For example, an upper surface side portion of the support substrate 12 of the through-electrode 42 is used to be electrically connected to the outside of the imaging device 11B.

In the imaging device 11B with such a configuration, similarly to the imaging device 11A of FIG. 3, it is possible to decrease the chip size as compared with the related art by a structure in which the electrode pad 26 and the through-electrode 42 are arranged at positions right below the pixel region 31 (FIG. 2) of the semiconductor substrate 14.

Second Method of Manufacturing Imagine Device

A method of manufacturing the imaging device 11B of FIG. 6 will be described with reference to FIGS. 7 and 8.

First, the similar steps to the first to sixth steps described with reference to FIGS. 4 and 5 are performed. Accordingly, an intermediate structure is manufactured in which the through-holes 25-1 to 25-3 are formed in the support substrate 12 so that the electrode pads 26-1 to 26-3 are opened.

Figure 7:
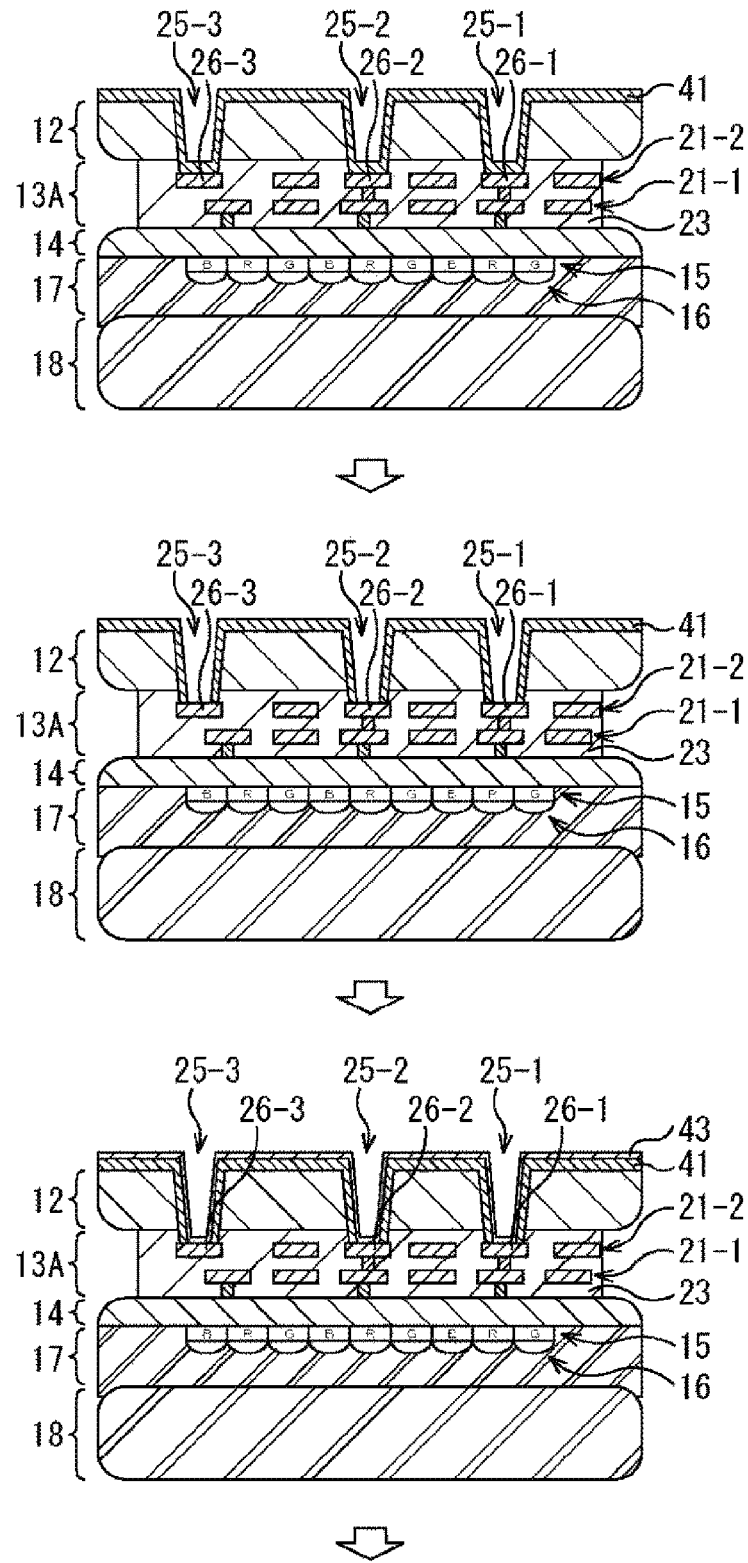
FIG. 7 is a diagram illustrating a second method of manufacturing the imaging device.

Next, in an eleventh step, as shown in the first stage of FIG. 7, the insulation film 41 is formed on the entirety of the upper surface of the support substrate 12 including the bottom surface and the side surface of the through-hole 25 by, for example, a plasma chemical vapor deposition (CVD) method.

In a twelfth step, as shown in the second stage of FIG. 7, the electrode pad 26 is exposed by removing the insulation film 41 of the bottom surface of the through-hole 25 using, for example, an etching-back method.

In a thirteenth steep, as shown in the third stage of FIG. 7, a barrier metal film (not shown) is formed on the entirety of the upper surface of the support substrate 12 by including the bottom surface and the side surface of the through-hole 25 by using, for example, a sputtering method and then a seed layer 43 is formed.

Here, the barrier metal film is formed to prevent the diffusion of the connection conductor (copper forming the through-electrode 42 in the configuration example of the imaging device 11B). As the barrier metal film, for example, titanium (Ti), tungsten (W), an oxide film of titanium or tungsten, or the like can be used. Further, an alloy thereof may be used as the barrier metal film. Furthermore, titanium is preferably used as the barrier metal film in the imaging device 11B. The seed layer 43 is used as an electrode when burying the connection conductor by, for example, an electrode plating method.

Figure 8:
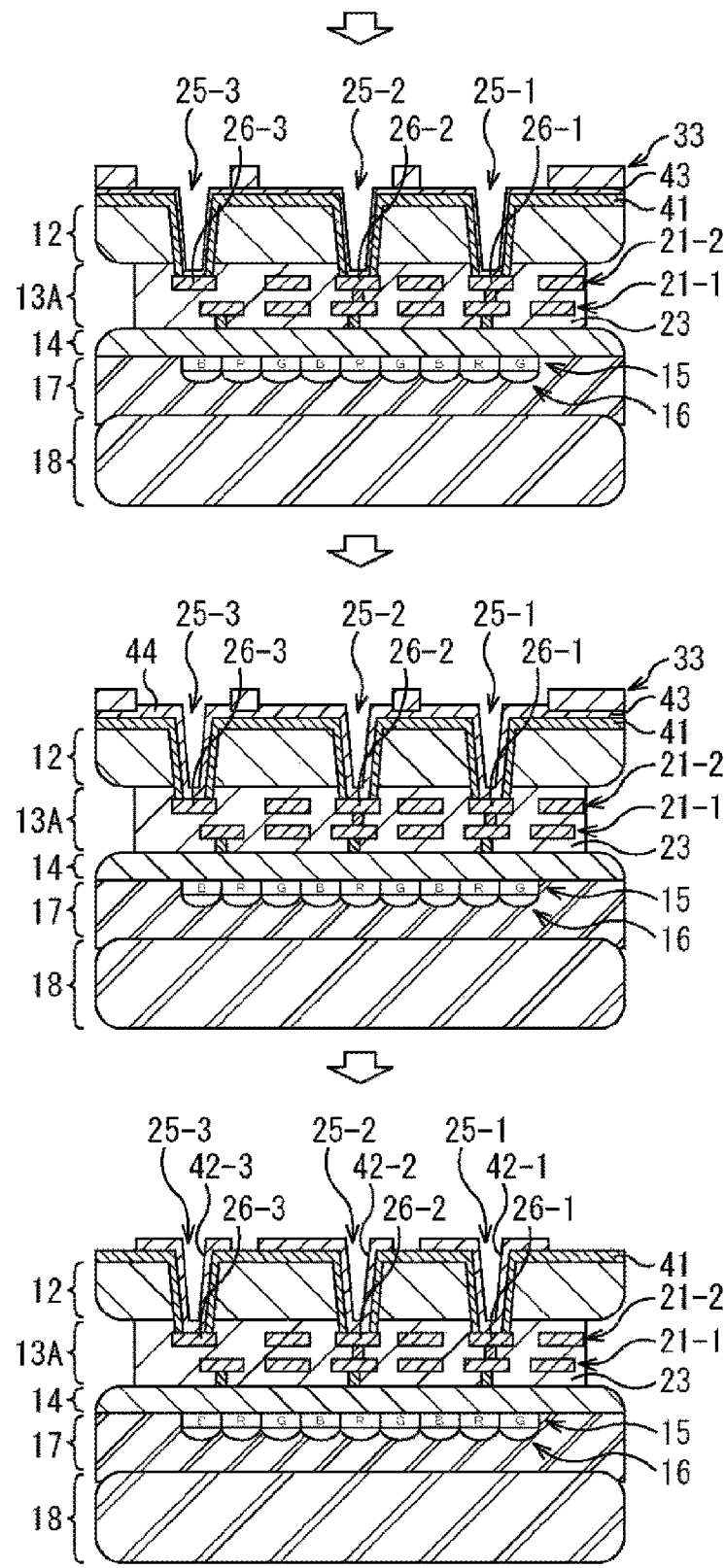
FIG. 8 is a diagram illustrating the second method of manufacturing the imaging device.

In a fourteenth step, as shown in the first stage of FIG. 8, the resist pattern 33 is formed in a predetermined region in which the through-electrodes 42-1 to 42-3 are not formed on the upper surface of the seed layer 43.

In a fifteenth step, as shown in the second stage of FIG. 8, a plating layer 44 is formed on the seed layer 43 at a position not provided with the resist pattern 33 by electroplating the connection conductor until the through-electrode 42 becomes thick.

In a sixteenth step, the resist pattern 33 is removed and the seed layer 43 and the barrier metal film (not shown) formed below the resist pattern 33 are then removed by, for example, wet etching. Accordingly, the plating layer 44 which is continuous by the seed layer 43 becomes independent and then the through-electrodes 42-1 to 42-3 are formed as shown in the third stage of FIG. 8. At this time, a rewiring is formed on the upper surface of the support substrate 12.

Then, the imaging device 11B shown in FIG. 6 is manufactured by cutting the resist pattern into a prescribed external shape.

As described above, the imaging device 11B can be manufactured by a manufacturing method of laminating the color filter layer 15 and the on-chip lens layer 16 on the light receiving surface side of the semiconductor substrate 14, forming the through-hole 25 in the support substrate 12, and then forming the through-electrode 42.

Furthermore, the imaging device 11B can be used in the configuration state shown in FIG. 6, but may be used in a configuration in which a solder ball is provided on the through-electrode 42 if necessary.

For example, FIG. 9 shows a modified example of the imaging device 11B. As shown in FIG. 9A, a photosensitive solder resist 34 is applied and then is subjected to exposure and development so that a part of the through-electrode 42 on the upper surface of the support substrate 12 is opened as a land portion for mounting a solder ball thereto. Then, for example, as shown in FIG. 9B, solder balls 35-1 to 35-3 are mounted on the land portions and are respectively electrically connected to the through-electrodes 42-1 to 42-3 by using a ball transfer method.

Fourth Configuration Example of Imaging Device

Figure 10:
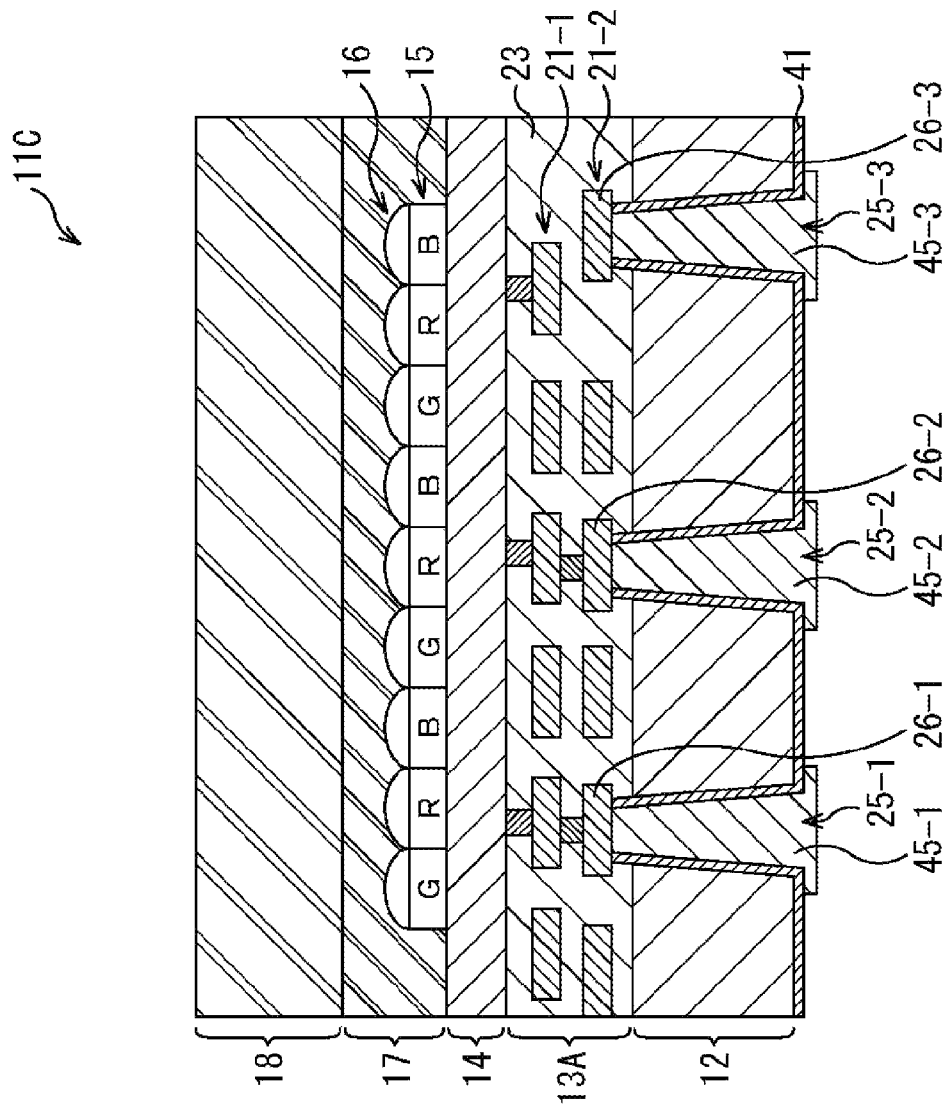
FIG. 10 is a diagram showing a configuration example of a fourth embodiment of the imaging device.

FIG. 10 is cross-sectional view showing a fourth configuration example of the imaging device 11. Furthermore, in an imaging device 11C shown in FIG. 10, the same reference numerals will be given to the configurations common to the imaging device 11B of FIG. 6 and a detailed description thereof will be omitted.

As shown in FIG. 10, the imaging device 11C is formed by laminating the support substrate 12, the multi-layer wiring layer 13A, the semiconductor substrate 14, the color filter layer 15, the on-chip lens layer 16, the glass sealing resin layer 17, and the glass protective substrate 18 similarly to the imaging device 11B of FIG. 6. Further, in the imaging device 11C, similarly to the imaging device 11B of FIG. 6, the electrode pads 26-1 to 26-3 are arranged on the multi-layer wiring layer 13A, the through-holes 25-1 to 25-3 are formed in the support substrate 12 so that the electrode pads 26-1 to 26-3 are opened, and the insulation film 41 is formed.

Then, the imaging device 11C has a configuration in which an embedded type through-electrode 45 is formed inside the through-hole 25. For example, the embedded type through-electrode 45 can be formed by burying the through-hole 25 with a connection conductor at the time of performing electrode plating in the above-described fifteenth step (the second stage of FIG. 8).

The imaging device 11C with such a configuration can decrease the chip size as compared with the related art by a structure in which the electrode pad 26 and the embedded type through-electrode 45 are arranged at positions right below the pixel region 31 (FIG. 2) of the semiconductor substrate 14 similarly to the imaging device 11B of FIG. 6.

Fifth Configuration Example of Imaging Device

Figure 11:
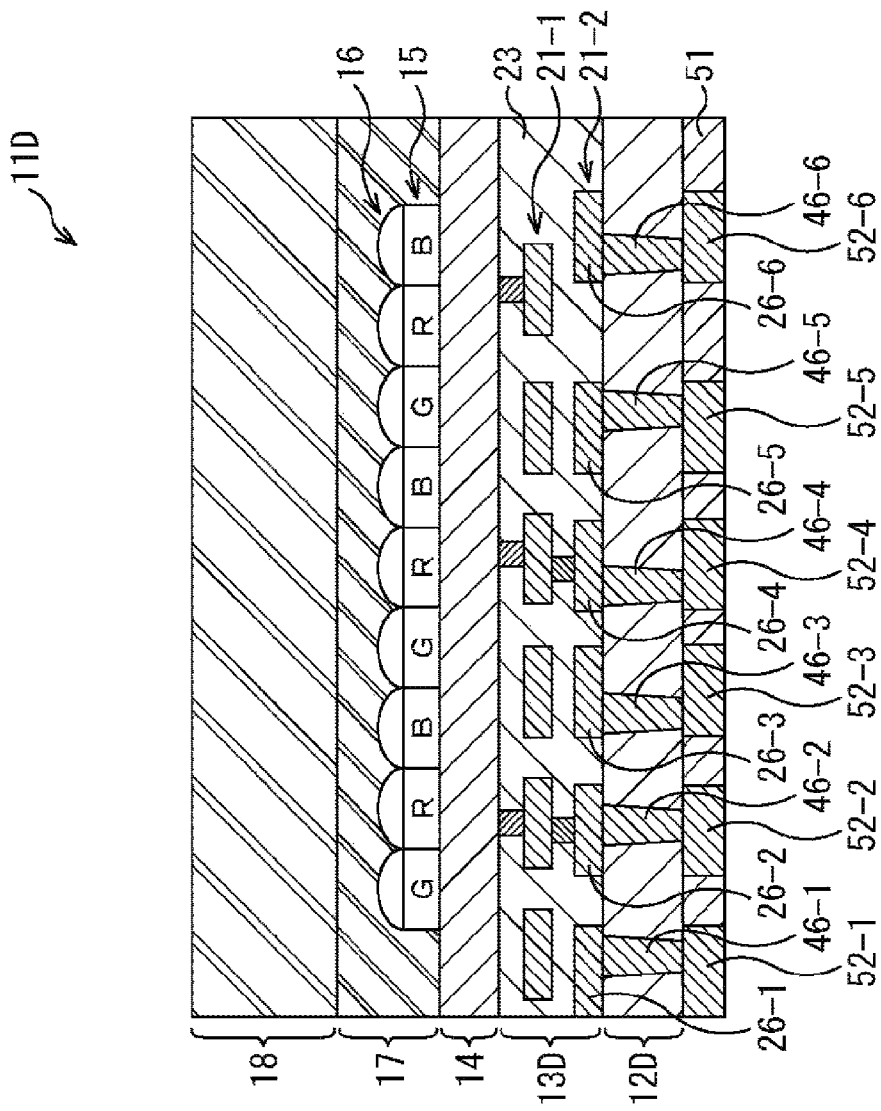
FIG. 11 is a diagram showing a configuration example of a fifth embodiment of the imaging device.

FIG. 11 is a cross-sectional view showing a sixth configuration example of the imaging device 11. Furthermore, in an imaging device 11D shown in FIG. 11, the same reference numerals will be given to the configurations common to the imaging device 11A of FIG. 3 and a detailed description thereof will be omitted.

As shown in FIG. 11, the imaging device 11D is formed by laminating a support substrate 12D, a multi-layer wiring layer 13D, the semiconductor substrate 14, the color filter layer 15, the on-chip lens layer 16, the glass sealing resin layer 17, and the glass protective substrate 18.

The imaging device 11D has a configuration in which electrode pads 26-1 to 26-6 provided on the second wiring layer 21-2 are exposed to a front surface of the multi-layer wiring layer 13D. Then, through-electrodes 46-1 to 46-6 which are formed to penetrate the support substrate 12D are connected to the electrode pads 26-1 to 26-6 at the bonding surface between the support substrate 12D and the multi-layer wiring layer 13D. For example, the imaging device 11D is formed by hybrid bonding the multi-layer wiring layer 13D and the support substrate 12D in which the through-electrodes 46-1 to 46-6 are buried in the through-holes in advance through an insulation film (not shown).

Further, the imaging device 11D has a configuration in which buried electrode pads 52-1 to 52-6 are formed on a front surface of the support substrate 12D corresponding to the through-electrodes 46-1 to 46-6 so as to be buried by an insulation film 51 formed on the entire surface of the support substrate 12D.

The imaging device 11D with such a configuration can decrease the chip size as compared with the related art by a structure in which the electrode pad 26 and the buried electrode pad 52 are arranged at positions right below the pixel region 31 (FIG. 2) of the semiconductor substrate 14 similarly to the imaging device 11A of FIG. 3.

Third Method of Manufacturing Imaging Device

A method of manufacturing the imaging device 11D of FIG. 11 will be described with reference to FIGS. 12 to 14.

Figure 12:
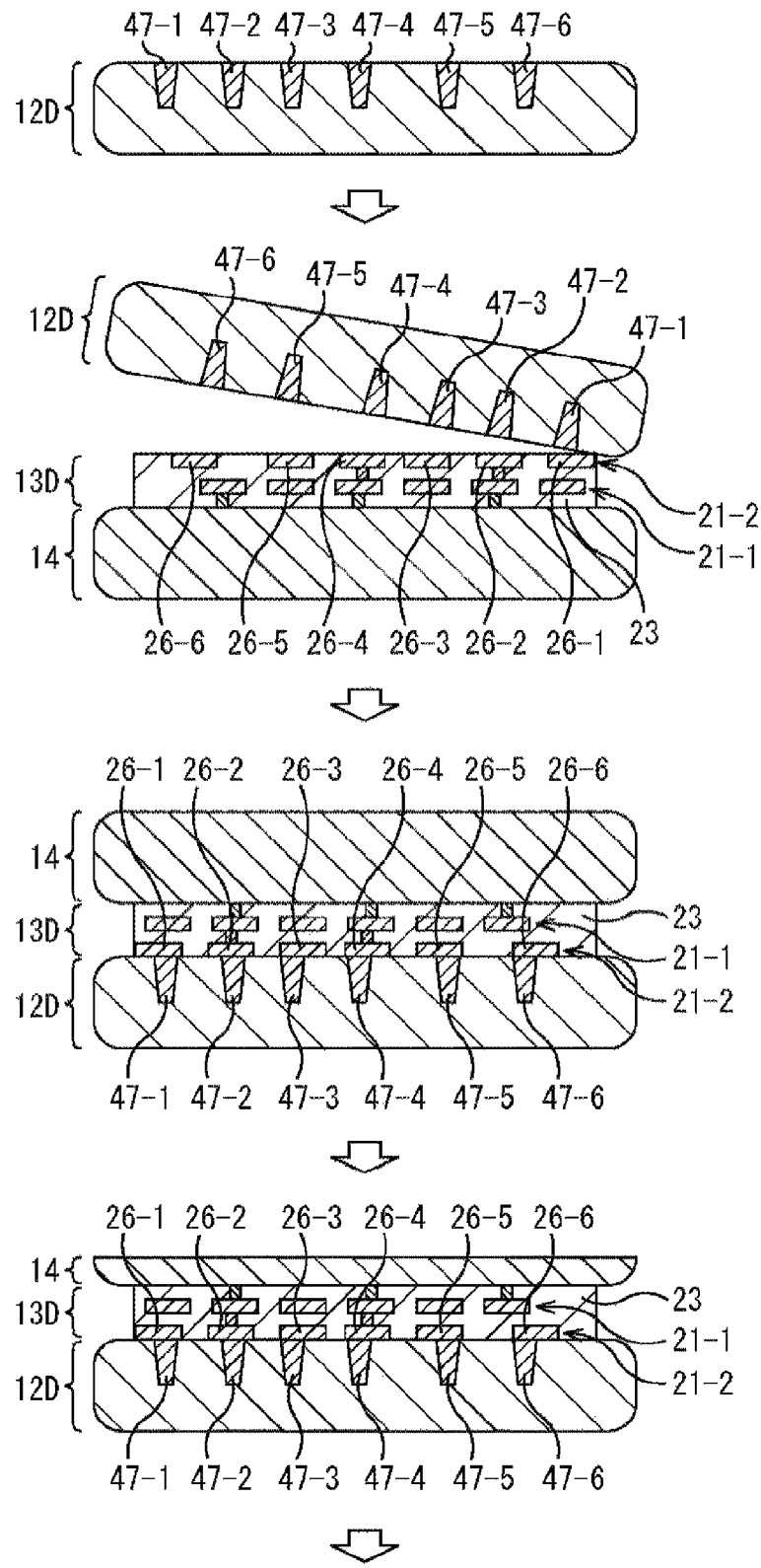
FIG. 12 is a diagram illustrating a third method of manufacturing the imaging device.

First, in a twenty first step, as shown in the first stage of FIG. 12, non-penetration vies 47-1 to 47-6 having a length not penetrating the support substrate 12D are formed in the support substrate 12D.

For example, a resist pattern provided with an opening portion having a diameter of about 2.0 µm to 10.0 µm is formed on the upper surface of the support substrate 12D and dry etching is performed by using the resist pattern as a mask to form a via having a depth of about 30 µm to 80 µm. Then, after the resist pattern is removed, a thermal oxide film is formed in a diffusion furnace or an LP-SiN film is formed by a CVD device. Next, for example, a barrier metal film of tungsten is formed and a seed layer of copper are formed by a sputtering method and the via is filled with copper by using an electrode plating method. Then, extra copper is removed by a chemical mechanical polishing (CMP) method to form a hybrid bonding pad and to perform a flattening process. With such a method, the non-penetration vias 47-1 to 47-6 can be formed in the support substrate 12D.

Meanwhile, in the multi-layer wiring layer 13D of the semiconductor substrate 14, the electrode pads 26-1 to 26-6 connected to the non-penetration vias 47-1 to 47-6 of the support substrate 12D are formed at positions right below (right above in the step) the pixel region 31 of the semiconductor substrate 14 by using a damascene method.

In a twenty second step, as shown in the second stage of FIG. 12, the support substrate 12D is bonded to the multi-layer wiring layer 13D laminated on the semiconductor substrate 14. At this time, the electrode pads 26-1 to 26-6 of the multi-layer wiring layer 13D and the non-penetration vias 47-1 to 47-6 of the support substrate 12D are bonded (Cu—Cu bonded) by the same conductor and the support substrate 12D and the interlayer insulation film 23 are hybrid-bonded while facing each other.

In a twenty third step, as shown in the third stage of FIG. 12, the intermediate structure including the support substrate 12D, the multi-layer wiring layer 13D, and the semiconductor substrate 14 is inverted.

In a twenty fourth step, as shown in the fourth stage of FIG. 12, the semiconductor substrate 14 is thinned from the back surface side.

Figure 13:
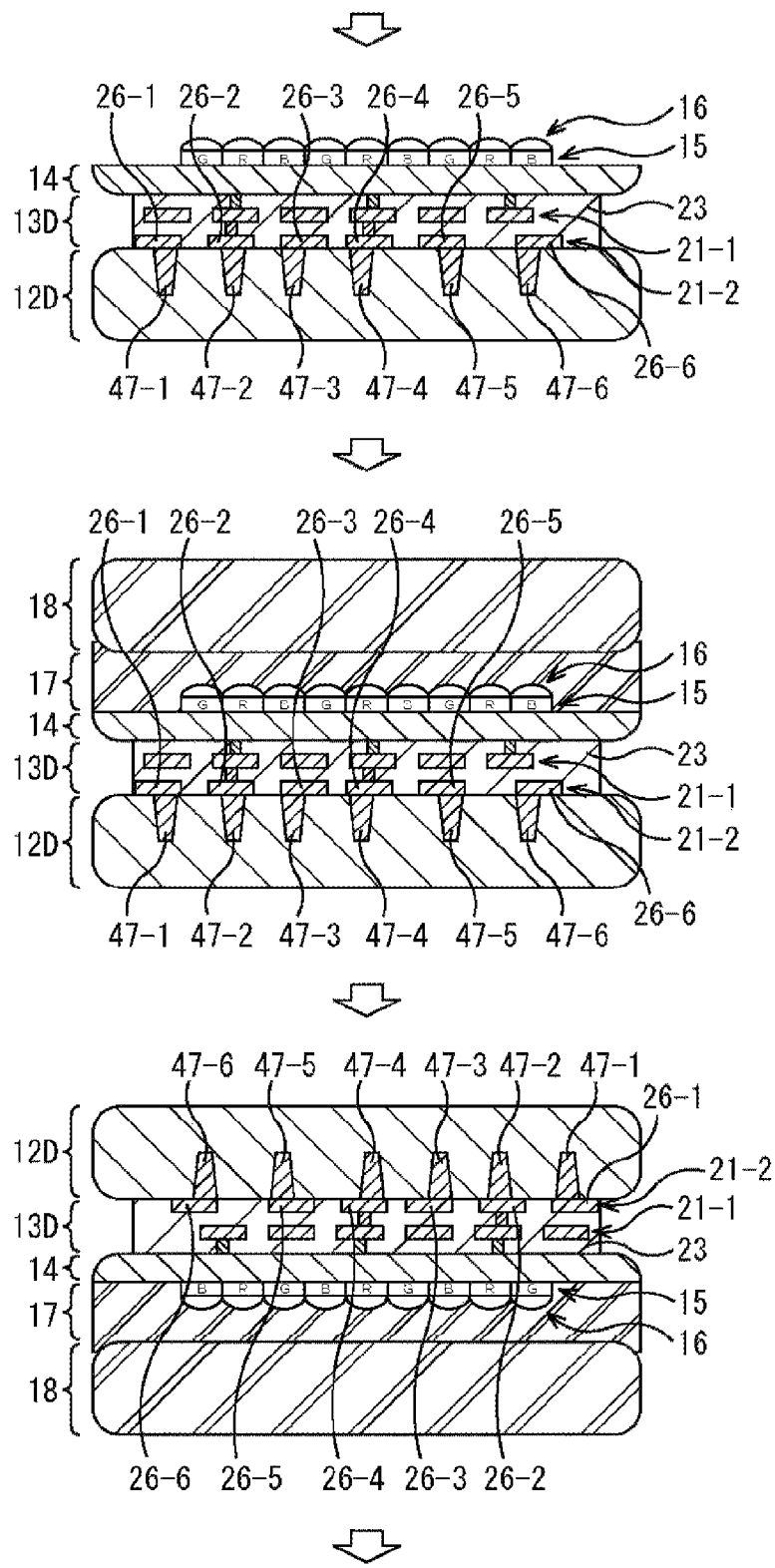
FIG. 13 is a diagram illustrating the third method of manufacturing the imaging device.

In a twenty fifth step, as shown in the first stage of FIG. 13, the color filter layer 15 and the on-chip lens layer 16 are laminated on the back surface of the semiconductor substrate 14.

In a twenty sixth step, as shown in the second stage of FIG. 13, an adhesive which becomes the glass sealing resin layer 17 is applied to the entire back surface side of the semiconductor substrate 14 by including the on-chip lens layer 16 so that the glass protective substrate 18 is adhered thereto. Accordingly, the glass protective substrate 18 and the semiconductor substrate 14 are bonded as a cavity-less structure through the glass sealing resin layer 17.

In a twenty seventh step, as shown in the third stage of FIG. 13, the intermediate structure including the support substrate 12D, the multi-layer wiring layer 13D, the semiconductor substrate 14, the color filter layer 15, the on-chip lens layer 16, the glass sealing resin layer 17, and the glass protective substrate 18 is inverted.

In a twenty eighth step, the support substrate 12D is thinned by using a back grinding technology such as grinding and polishing, the heads of the non-penetration vias 47-1 to 47-6 are projected, and the entire surface of the support substrate 12D is engraved by wet etching or dry etching. Accordingly, the non-penetration vias 47-1 to 47-6 penetrate the support substrate 12D so that the through-electrodes 46-1 to 46-6 are formed as shown in the first stage of FIG. 14. Furthermore, the front ends of the through-electrodes 46-1 to 46-6 may be formed to be projected from the support substrate 12D.

In a twenty ninth step, as shown in the second stage of FIG. 14, the insulation film 51 is formed on the entire surface of the support substrate 12D. At this time, for example, the insulation film 51 is formed by using a low-temperature CVD method of 200° C. or less at which no damage occurs in the color filter layer 15.

In the thirtieth step, in order to form the buried electrode pads 52-1 to 52-6, a resist pattern is formed on the insulation film 51 and the insulation film 51 is subjected to a grooving process according to a dry etching method. Then, similarly to a damascene method, a barrier metal film and a seed layer is formed according to a sputtering method and then the buried electrode pads 52-1 to 52-6 are formed by using an electrode plating method and a CMP method as shown in the third stage of FIG. 14.

Then, the imaging device 11D shown in FIG. 11 is manufactured by cutting the resist pattern into a prescribed external shape.

As described above, the imaging device 11D can be manufactured by a manufacturing method of bonding the support substrate 12D provided with a non-penetration via 47 becoming the through-electrode 46 to the semiconductor substrate 14 and then laminating the color filter layer 15 and the on-chip lens layer 16 on the light receiving surface side of the semiconductor substrate 14. Accordingly, in the imaging device 11D, since it is possible to apply a high-temperature process at the time of forming the non-penetration via 47 which becomes the through-electrode 46, it is possible to further improve reliability.

That is, generally, in a configuration with the color filter layer 15, since there is a limitation in process temperature after forming the color filter layer 15, it is necessary to maintain a low temperature of 250° C. or less in a process of forming a back surface side electrode. For this reason, since it is difficult to form a dense oxide film in order to insulate the inside of the through-hole penetrating the support substrate 12, there is a possibility that reliability may be degraded.

In contrast, in the imaging device 11D, since the non-penetration via 47 becoming the through-electrode 46 is formed before forming the color filter layer 15, it is possible to form an insulation film for insulating the through-electrode 46 from the support substrate 12D by a high-temperature process. For example, in the imaging device 11D, it is possible to form an insulation film (a silicon isolation film) at a temperature higher than the heat resistance of the color filter layer 15. Thus, in the imaging device 11D, since it is possible to obtain a satisfactory insulation property of the through-electrode 46 with respect to the support substrate 12D by forming an insulation film having high insulation resistance, it is possible to avoid a decrease in reliability.

Furthermore, the method of manufacturing the imaging device 11D is not limited to the steps described with reference to FIGS. 12 to 14.

A first modified example of the method of manufacturing the imaging device 11D will be described with reference to FIG. 15.

For example, at the time of thinning the support substrate 12D by the above-described twenty eighth step (the first stage of FIG. 14), the thinning is stopped before the heads of the non-penetration vias 47-1 to 47-6 are projected. Then, in a forty first step, the resist pattern 33 provided with opening portions corresponding to the buried electrode pads 52-1 to 52-6 is formed on the support substrate 12D and the support substrate 12D is engraved by dry etching. Furthermore, at this time, the non-penetration vias 47-1 to 47-6 are protected by oxidization. Further, an insulation film (not shown) is formed by using a low-temperature CVD method of 200° C. or less at which no damage occurs in the color filter layer 15. Next, an etching back process is performed on the entire surface within a range in which the oxide film of the front surface of the support substrate 12D is not removed so that the non-penetration vias 47-1 to 47-6 penetrate the support substrate 12D to become the through-electrodes 46-1 to 46-6 as shown at the upper side of FIG. 15.

Next, in a forty second step, similarly to a damascene method, a barrier metal film and a seed layer are formed according to a sputtering method and then the buried electrode pads 52-1 to 52-6 buried in the support substrate 12D are formed by using an electrode plating method and a CMP method. Then, a structure in which the electrode pads 52-1 to 52-6 are buried in the support substrate 12D can be formed as shown at the lower side of FIG. 15 by removing the resist pattern 33.

The imaging device 11D can be manufactured by such a manufacturing method.

A second modified example of the method of manufacturing the imaging device 11D will be described with reference to FIG. 16.

For example, at the time of thinning the support substrate 12D by the above-described twenty eighth step (the first stage of FIG. 14), the thinning is stopped before the heads of the non-penetration vias 47-1 to 47-6 are projected.

Figure 16:
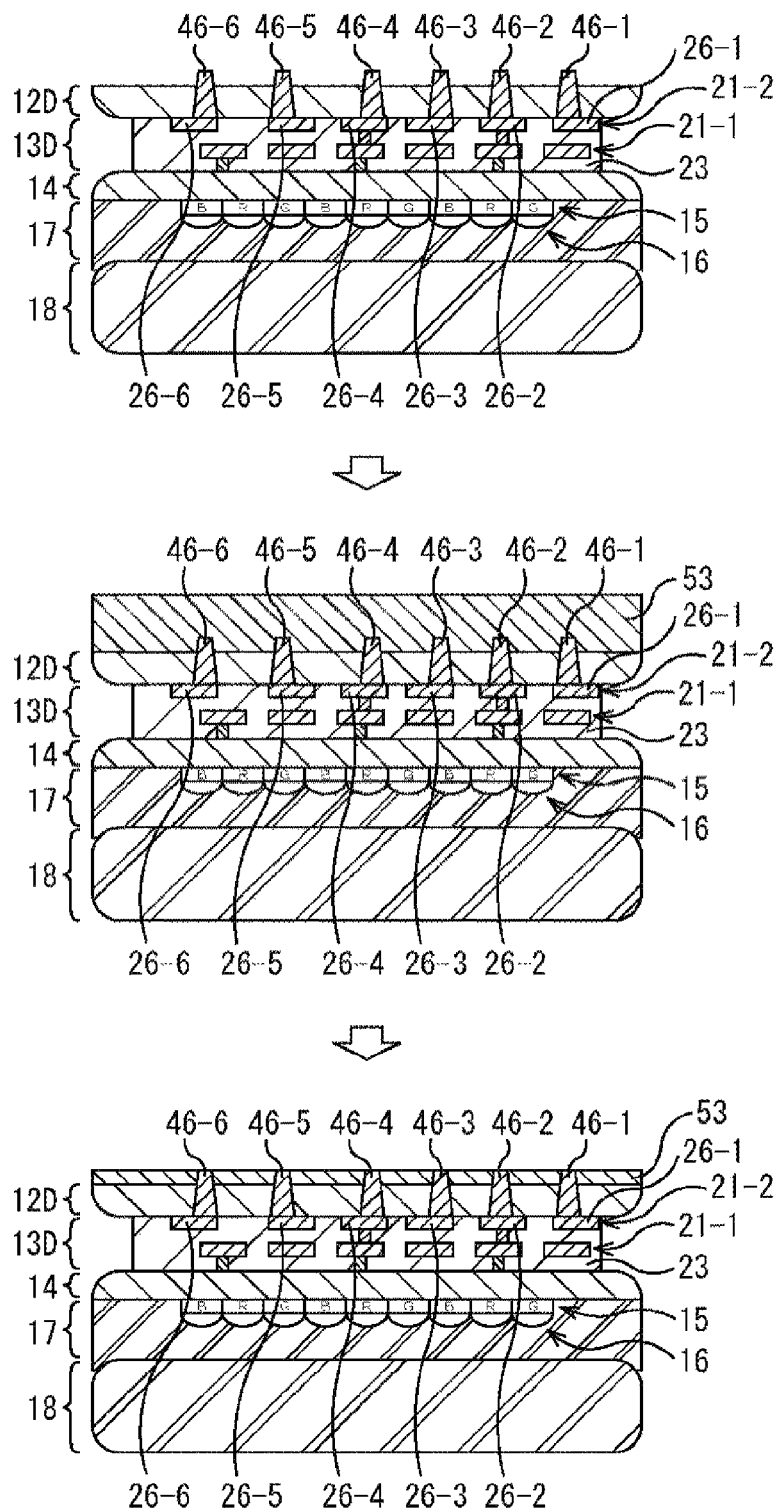
FIG. 16 is a diagram illustrating a second modified example of the third method of manufacturing the imaging device.

Then, in a fifty first step, for example, the entire surface of the support substrate 12D is etched back by wet etching so that the non-penetration vias 47-1 to 47-6 penetrate the support substrate 12D to become the through-electrodes 46-1 to 46-6 as shown at the upper side of FIG. 16. At this time, the through-electrodes 46-1 to 46-6 are protected by oxidization and are etched so that the front ends are projected from the support substrate 12D.

Next, in a fifty second step, as shown in the middle of FIG. 16, an insulation film 53 which includes, for example, organic resin such as solder resist is formed on the entire surface of the support substrate 12D.

Then, the insulation film 53 is thinned by a CMP method, a back grinding method, or a surface planar (byte grinding) method so that the heads of the through-electrodes 46-1 to 46-6 are projected as shown at the lower side of FIG. 16. In this way, it is possible to form a structure in which the front end surfaces of the through-electrodes 46-1 to 46-6 are exposed from the insulation film 53 and are used as the electrode pads.

The imaging device 11D can be manufactured by such a manufacturing method.

A third modified example of the method of manufacturing the imaging device 11D will be described with reference to FIGS. 17 to 20.

Figure 17:
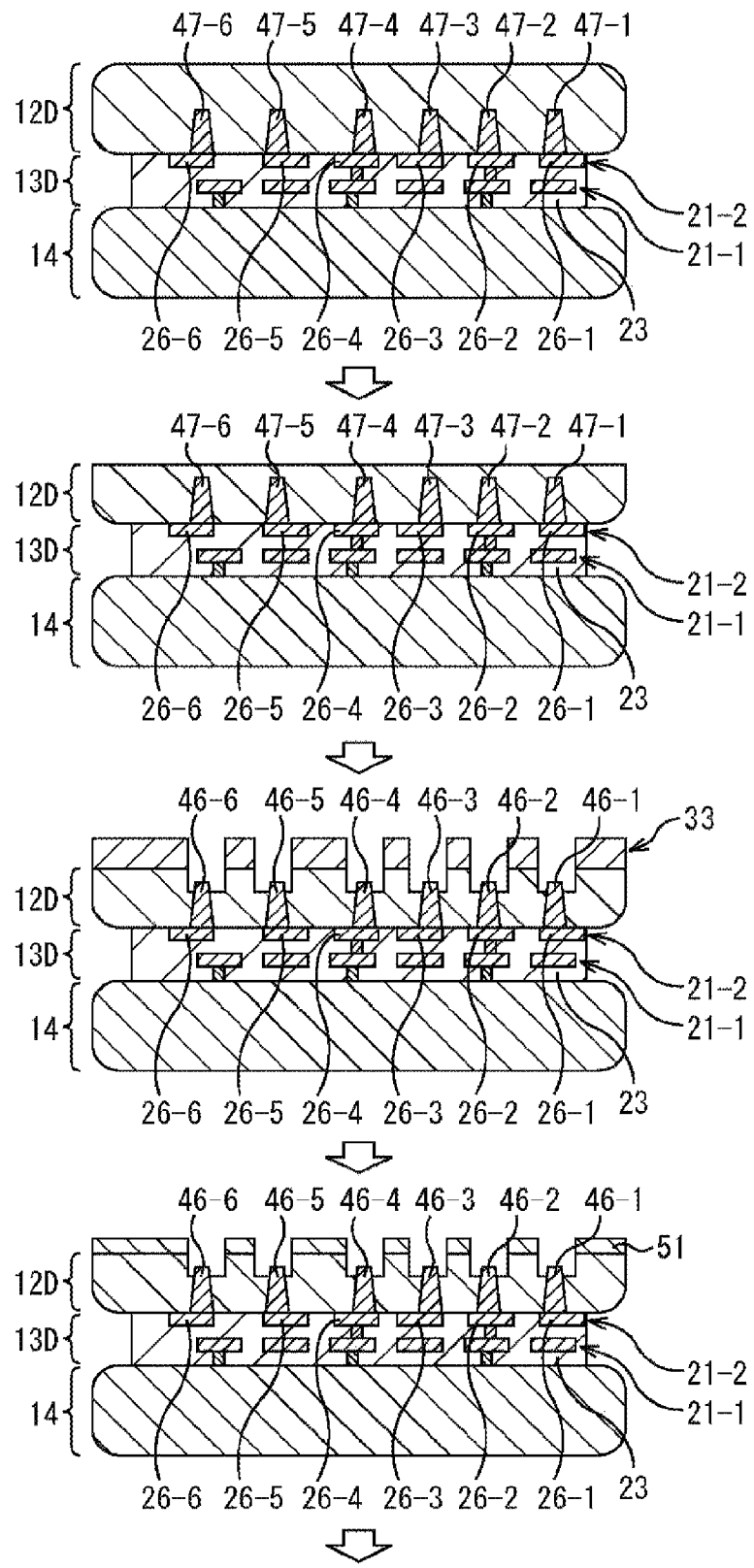
FIG. 17 is a diagram illustrating a third modified example of the third method of manufacturing the imaging device.

For example, in a sixty first step, as shown in the first stage of FIG. 17, the support substrate 12D is bonded to the multi-layer wiring layer 13D laminated on the semiconductor substrate 14 similarly to the above-described twenty second step (the second stage of FIG. 12).

In a sixty second step, as shown in the second stage of FIG. 17, the support substrate 12D is thinned and the thinning is stopped before the non-penetration vias 47-1 to 47-6 are exposed. Alternatively, the thinning may be stopped at the exposure timing of the non-penetration vias 47-1 to 47-6.

In a sixty third step, the resist pattern 33 provided with opening portions formed to correspond to the non-penetration vias 47-1 to 47-6 is formed on the support substrate 12D and a grooving process is performed on the support substrate 12D by using the resist pattern 33 as a mask. Accordingly, the non-penetration vias 47-1 to 47-6 penetrate the support substrate 12D and the through-electrodes 46-1 to 46-6 are formed as shown in the third stage of FIG. 17.

In a sixty fourth step, the resist pattern 33 is removed and then the insulation film 51 is formed on the support substrate 12D. At this time, it is possible to form the insulation film 51, for example, at a temperature of about 400° C. used to form general copper wiring compared to a case before the color filter layer 15 is formed. Then, the entire surface is etched back to a degree that the front surface of the support substrate 12D is not exposed so that the through-electrodes 46-1 to 46-6 are exposed as shown in the fourth stage of FIG. 17.

In a sixty fifth step, similarly to a damascene method, a barrier metal film and a seed layer are formed according to a sputtering method, then are subjected to an electrode plating method and a CMP method so that the electrode pads 52-1 to 52-6 buried in the support substrate 12D are formed and are flattened. Next, as shown in the first stage of FIG. 18, the electrode pads 52-1 to 52-6 are buried by the insulation film 51 to be capped.

Figure 18:
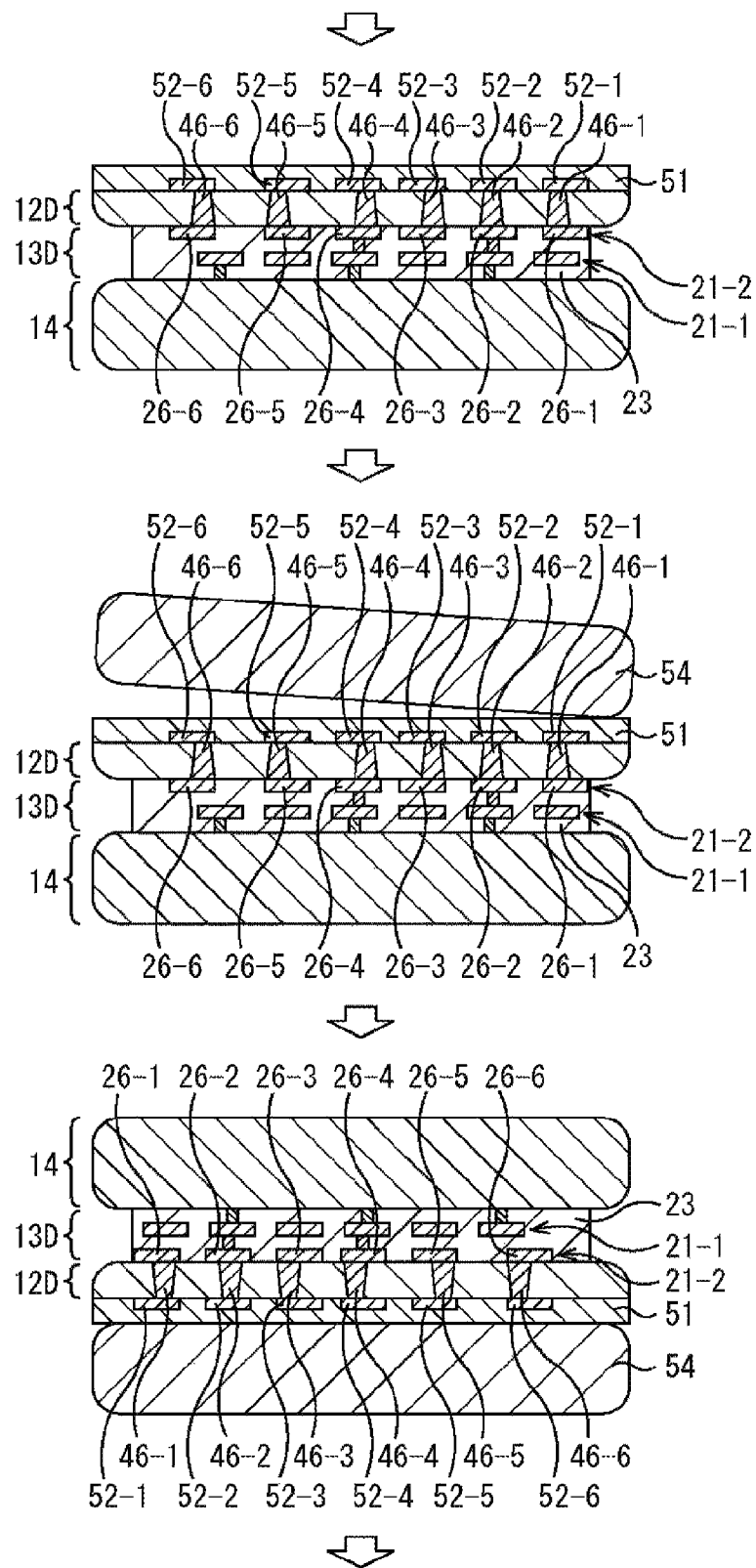
FIG. 18 is a diagram illustrating the third modified example of the third method of manufacturing the imaging device.

In a sixty sixth step, as shown in the second stage of FIG. 18, a temporary substrate 54 which is formed by, for example, a silicon substrate is bonded to the insulation film 51.

In a sixty seventh step, as shown in the third stage of FIG. 18, the intermediate structure including the support substrate 12D, the multi-layer wiring layer 13D, the semiconductor substrate 14, the insulation film 51, and the temporary substrate 54 is inverted.

Figure 19:
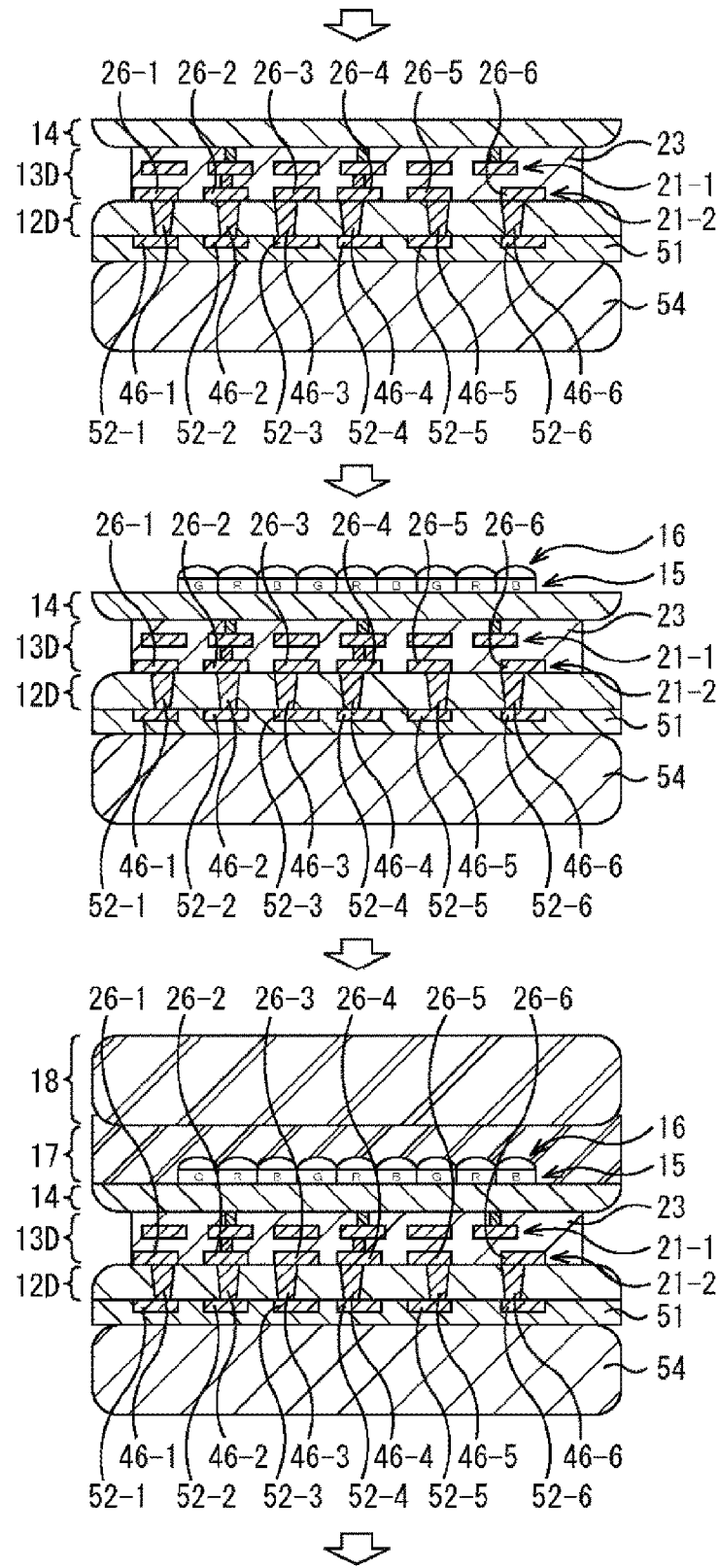
FIG. 19 is a diagram illustrating the third modified example of the third method of manufacturing the imaging device.

In a sixty eighth step, as shown in the first stage of FIG. 19, the semiconductor substrate 14 is thinned from the back surface side.

In sixty ninth step, as shown in the second stage of FIG. 19, the color filter layer 15 and the on-chip lens layer 16 are laminated on the back surface of the semiconductor substrate 14.

In a seventieth step, as shown in the third stage of FIG. 19, an adhesive which becomes the glass sealing resin layer 17 is applied to the entire back surface side of the semiconductor substrate 14 by including the on-chip lens layer 16 so that the glass protective substrate 18 is adhered thereto. Accordingly, the glass protective substrate 18 and the semiconductor substrate 14 are bonded in a cavity-less structure through the glass sealing resin layer 17.

Figure 20:
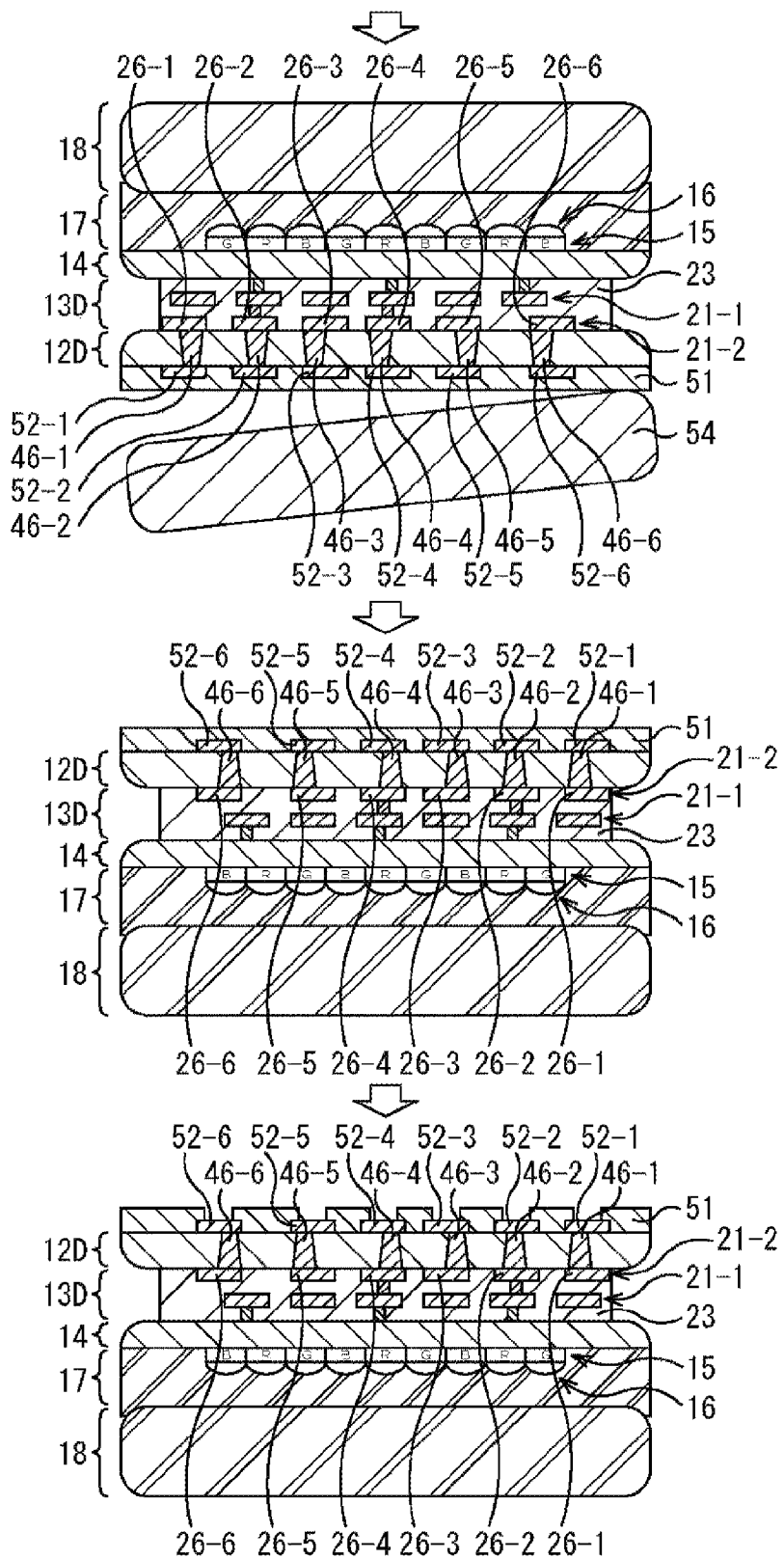
FIG. 20 is a diagram illustrating the third modified example of the third method of manufacturing the imaging device.

In a seventy first step, as shown in the first stage of FIG. 20, the temporary substrate 54 is separated from the intermediate structure.

In a seventy second step, as shown in the second stage of FIG. 20, the intermediate structure including the support substrate 12D, the multi-layer wiring layer 13D, the semiconductor substrate 14, the color filter layer 15, the on-chip lens layer 16, the glass sealing resin layer 17, the glass protective substrate 18, and the insulation film 51 is inverted.

In a seventy third step, as shown in the third stage of FIG. 20, a resist pattern is formed on the insulation film 51 so that the buried electrode pads 52-1 to 52-6 are exposed and the insulation film 51 is subjected to a grooving process according to a dry etching method. Alternatively, the buried electrode pads 52-1 to 52-6 may be exposed by performing an etching back process on the entire surface of the insulation film 51.

The imaging device 11D can be manufactured by such a manufacturing method. Then, in the manufacturing method, since it is possible to apply a high-temperature process to the periphery of the through-electrodes 46-1 to 46-3 as described above, it is possible to improve the reliability of the imaging device 11D.

Sixth Configuration Example of Imaging Device

Figure 21:
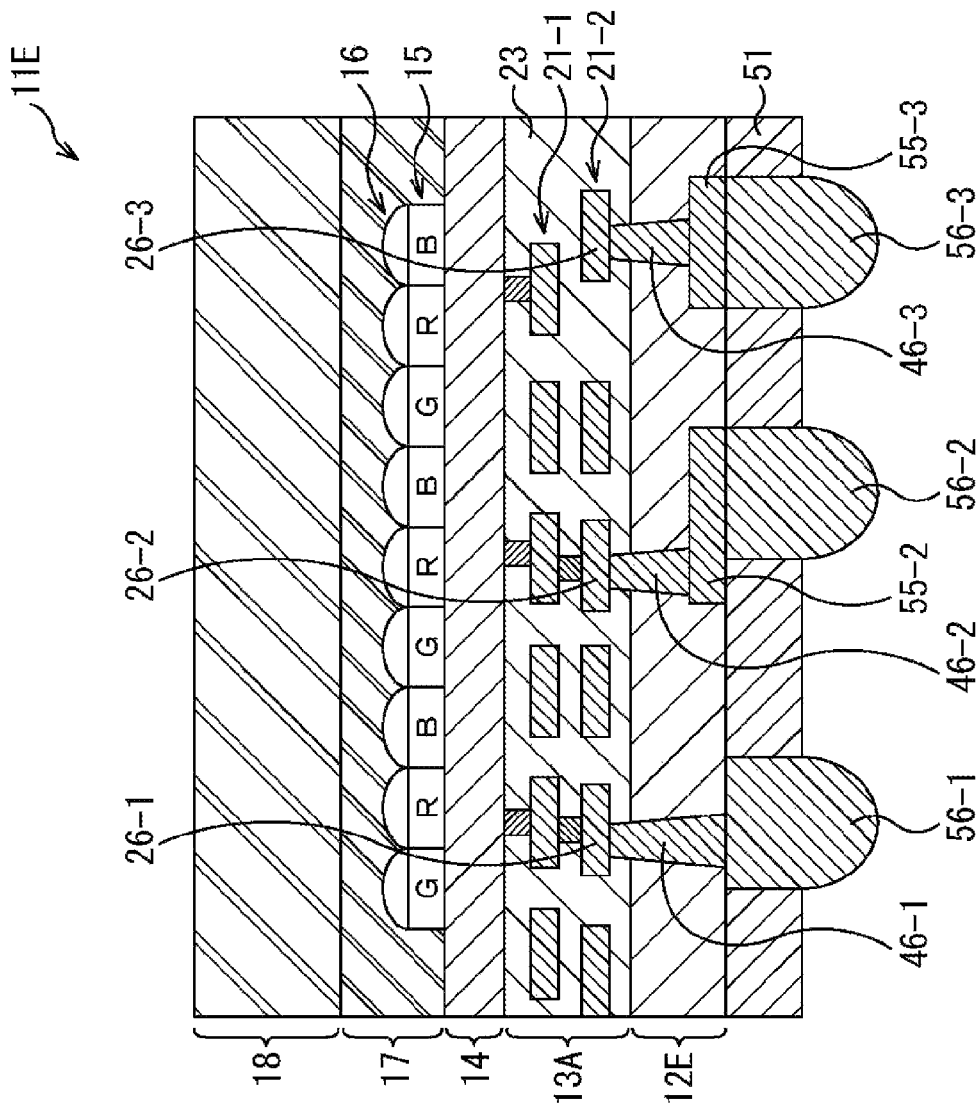
FIG. 21 is a diagram showing a configuration example of a sixth embodiment of the imaging device.

FIG. 21 is a cross-sectional view showing a sixth configuration example of the imaging device 11. Furthermore, in an imaging device 11E shown in FIG. 11, the same reference numerals will be given to the configurations common to the imaging device 11A of FIG. 3 and a detailed description thereof will be omitted.

As shown in FIG. 21, the imaging device 11E is formed by laminating a support substrate 12E, the multi-layer wiring layer 13A, the semiconductor substrate 14, the color filter layer 15, the on-chip lens layer 16, the glass sealing resin layer 17, and the glass protective substrate 18.

In the imaging device 11E, electrode pads 55-2 and 55-3 are formed to be exposed to the front surface of the support substrate 12E, the electrode pad 55-2 is electrically connected to the through-electrode 46-2, and the electrode pad 55-3 is electrically connected to the through-electrode 46-3.

Then, in the imaging device 11E, solder balls 56-1 to 56-3 are formed to protrude from the insulation film 51 formed on the entire surface of the support substrate 12E. The solder ball 56-1 is electrically connected to the through-electrode 46-1, the solder ball 56-2 is electrically connected to the electrode pad 55-2, and the solder ball 56-3 is electrically connected to the electrode pad 55-3. That is, in the imaging device 11D, the electrode pads 26-1 to 26-3 are respectively connected to the outside through the solder balls 56-1 to 56-3.

The imaging device 11D with such a configuration can decrease the chip size as compared with the related art by a structure in which the electrode pad 26 and the solder balls 56-1 to 56-3 are arranged at positions right below the pixel region 31 (FIG. 2) of the semiconductor substrate 14 similarly to the imaging device 11A of FIG. 3. For example, the imaging device 11D can be mounted on other substrates by flip chip bonding using the solder balls 56-1 to 56-3.

Fourth Method of Manufacturing Imaging Device

A method of manufacturing the imaging device 11E of FIG. 21 will be described with reference to FIGS. 22 and 26.

First, in an eighty first step, as shown in the first stage of FIG. 22, the multi-layer wiring layer 13A is laminated on a front surface of the semiconductor substrate 14.

In an eighty second step, as shown in the second stage of FIG. 22, the support substrate 12E is bonded from the upper side of the semiconductor substrate 14 through the multi-layer wiring layer 13A.

In an eighty third step, for example, the support substrate 12E is thinned to about 100 82 m by using a back grinding technology such as grinding and polishing. Then, as shown in the third stage of FIG. 22, through-holes are formed at positions corresponding to the electrode pads 26-1 to 26-3 in the support substrate 12E to bury the through-electrodes 46-1 to 46-3 and the front surface of the support substrate 12E is subjected to a grooving process to form the electrode pads 55-2 and 55-3.

Figure 23:
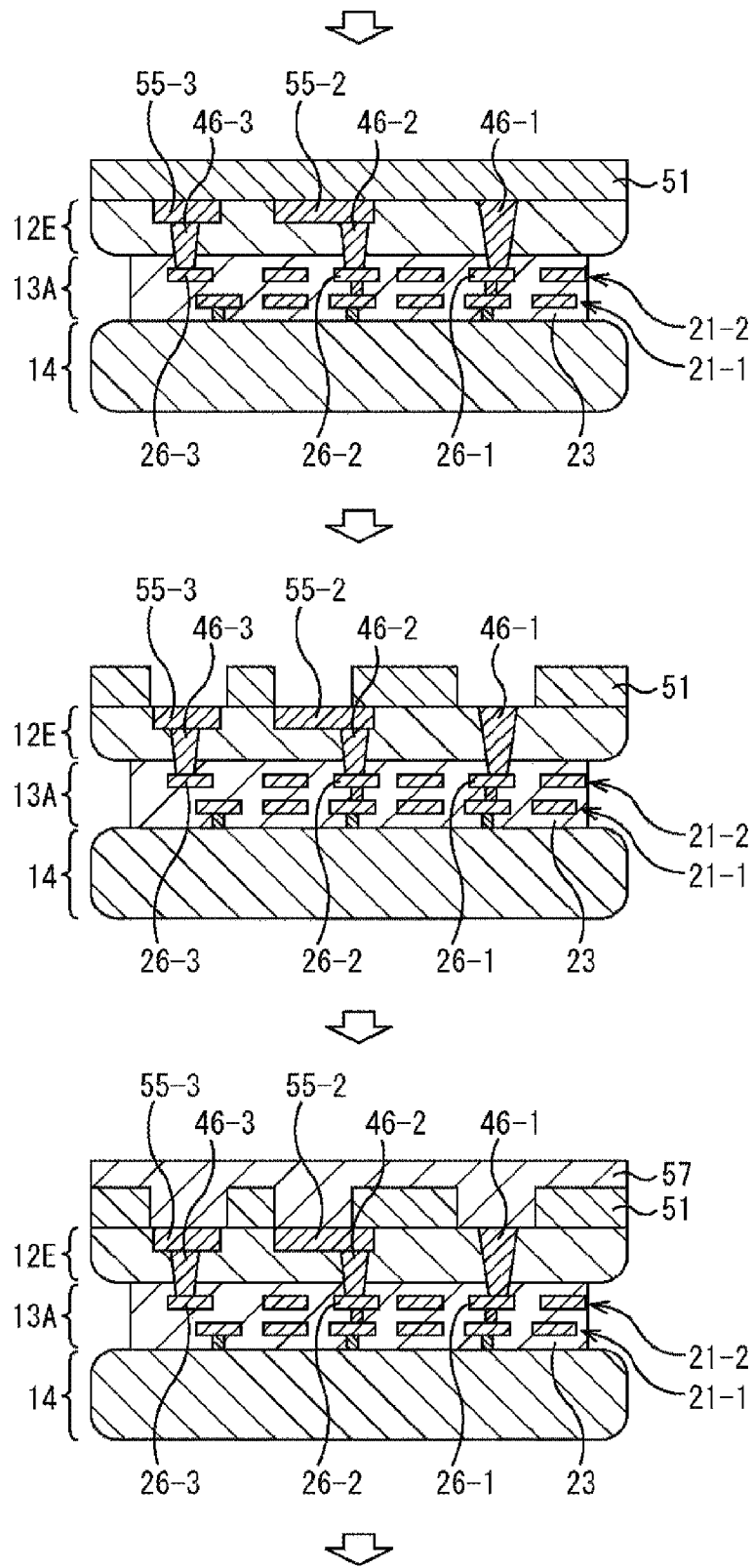
FIG. 23 is a diagram illustrating the fourth method of manufacturing the imaging device.

In an eighty fourth step, as shown in the first stage of FIG. 23, the insulation film 51 is formed on the entire surface of the support substrate 12E. At this time, it is possible to form the insulation film 51, for example, at a temperature of about 400° C. used to form general copper wiring compared to a case before the color filter layer 15 is formed.

In an eighty fifth step, as shown in the second stage of FIG. 23, opening portions are formed in the insulation film 51 to form land portions to which solder balls 56-1 to 56-3 are mounted in the following steps so that the through-electrode 46-1 and the electrode pads 55-2 and 55-3 are exposed.

In an eighty sixth step, as shown in the third stage of FIG. 23, a silicon oxide film 57 is formed on the entire surface of the insulation film 51 to bury the land portion and the surface thereof is flattened.

Figure 24:
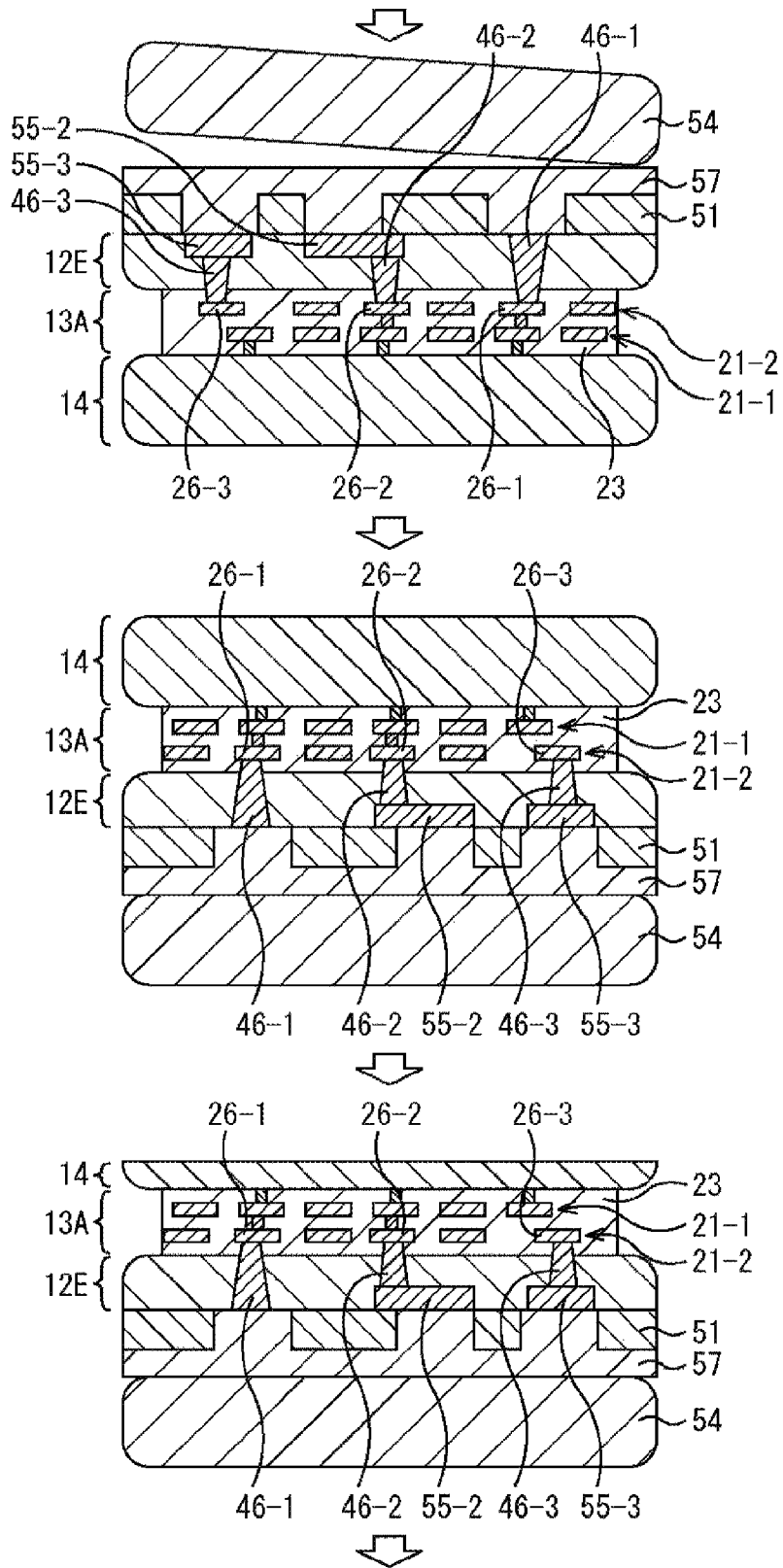
FIG. 24 is a diagram illustrating the fourth method of manufacturing the imaging device.

In an eighty seventh step, as shown in the first stage of FIG. 24, a temporary substrate 54 which is formed by, for example, a silicon substrate is bonded to the silicon oxide film 57.

In an eighty eighth step, as shown in the second stage of FIG. 24, the intermediate structure including the support substrate 12E, the multi-layer wiring layer 13A, the semiconductor substrate 14, the insulation film 51, the silicon oxide film 57, and the temporary substrate 54 is inverted.

In an eighty ninth step, as shown in the third stage of FIG. 24, the semiconductor substrate 14 is thinned from the back surface side.

Figure 25:
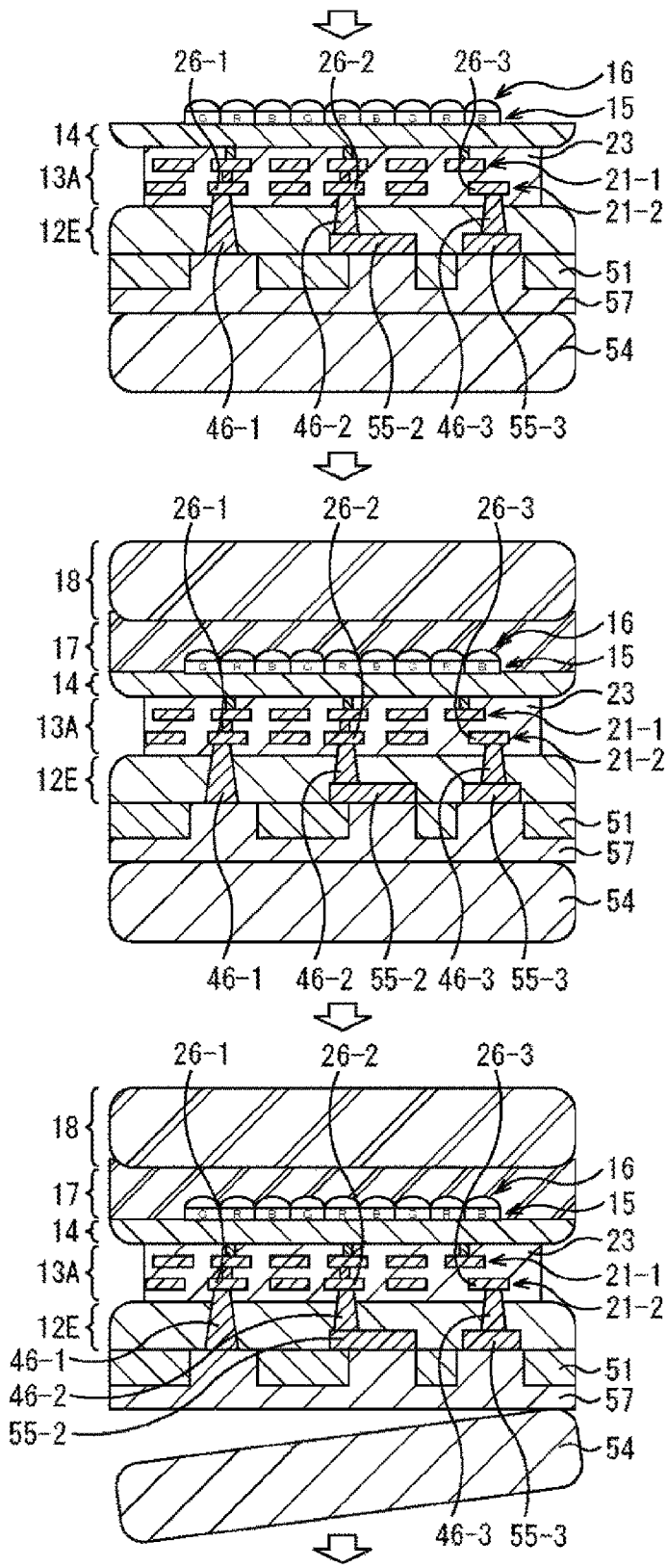
FIG. 25 is a diagram illustrating the fourth method of manufacturing the imaging device.

In a ninetieth step, as shown in the first stage of FIG. 25, the color filter layer 15 and the on-chip lens layer 16 are laminated on the back surface of the semiconductor substrate 14.

In a ninety first step, as shown in the second stage of FIG. 25, an adhesive which becomes the glass sealing resin layer 17 is applied to the entire back surface side of the semiconductor substrate 14 by including the on-chip lens layer 16 so that the glass protective substrate 18 is adhered thereto. Accordingly, the glass protective substrate 18 and the semiconductor substrate 14 are bonded in a cavity-less structure through the glass sealing resin layer 17.

In a ninety second step, as shown in the third stage of FIG. 25, the temporary substrate 54 is separated from the intermediate structure.

Figure 26:
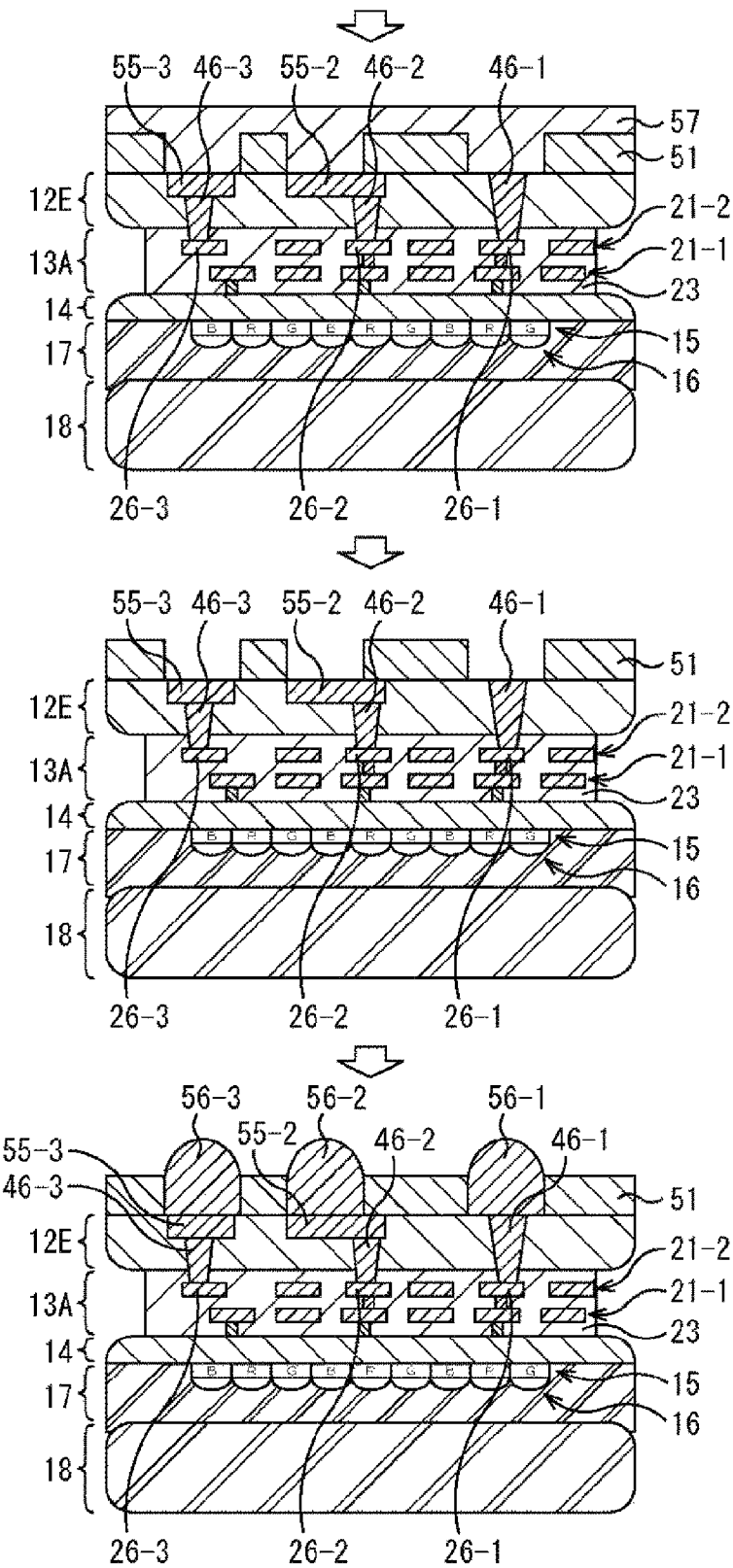
FIG. 26 is a diagram illustrating the fourth method of manufacturing the imaging device.

In a ninety third step, as shown in the first stage of FIG. 26, the intermediate structure including the support substrate 12E, the multi-layer wiring layer 13A, the semiconductor substrate 14, the color filter layer 15, the on-chip lens layer 16, the glass sealing resin layer 17, the glass protective substrate 18, the insulation film 51, and the silicon oxide film 57 is inverted.

In a ninety fourth step, as shown in the second stage of FIG. 26, the silicon oxide film 57 is removed to open the land portion.

In a ninety fifth step, as shown in the third stage of FIG. 26, the solder balls 56-1 to 56-3 are formed to be electrically connected to the through-electrode 46-1 and the electrode pads 55-2 and 55-3.

Then, the imaging device 11E shown in FIG. 21 is manufactured by cutting the resist pattern into a prescribed external shape.

As described above, the imaging device 11E can be manufactured by a manufacturing method of forming the through-electrodes 46-1 to 46-3 to penetrate the support substrate 12E and then laminating the color filter layer 15 and the on-chip lens layer 16 on the light receiving surface side of the semiconductor substrate 14. At this time, in the imaging device 11E, since it is possible to apply a high-temperature process to the periphery of the through-electrodes 46-1 to 46-3 as described above, it is possible to further improve reliability.

Seventh Configuration Example of Imaging Device

A seventh configuration example of the imaging device 11 will be described with reference to FIGS. 27 and 28.

For example, the imaging device 11 can form a wafer level chip size package (CSP) obtained by laminating a chip on wafer on a semiconductor substrate provided with a logic circuit, a memory circuit, or the like.

Figure 27:
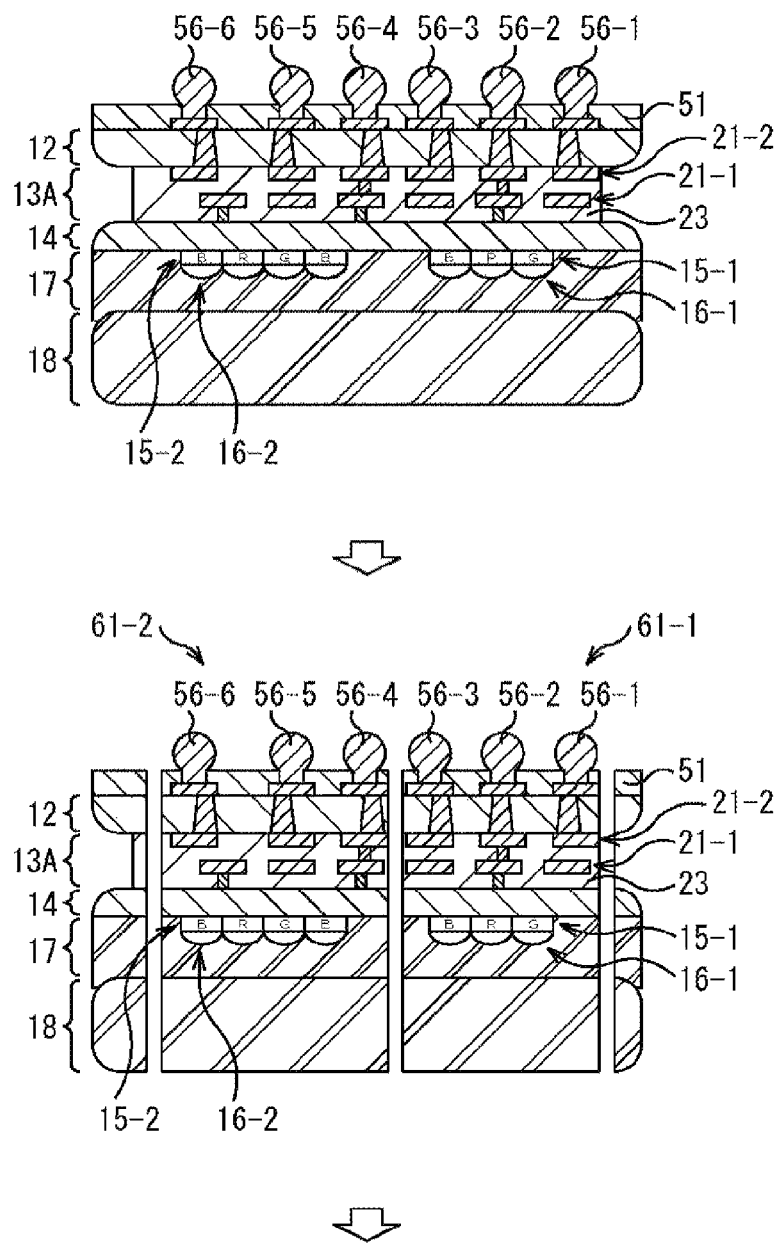
FIG. 27 is a diagram illustrating a seventh configuration example of the imaging device.

For example, as shown in the upper stage of FIG. 27, similarly to the imaging device 11E of FIG. 21, the solder balls 56-1 to 56-6 are provided and an intermediate structure is formed by including the support substrate 12, the multi-layer wiring layer 13A, the semiconductor substrate 14, color filter layers 15-1 and 15-2, on-chip lens layers 16-1 and 16-2, the glass sealing resin layer 17, and the glass protective substrate 18.

Then, as shown in the lower stage of FIG. 27, two chips 61-1 and 61-2 used as imaging devices are separated by dicing and are cut into a prescribed external shape. Here, the color filter layers 15-1 and 15-2 and the on-chip lens layers 16-1 and 16-2 are not continuous at the positions separated in this way.

Figure 28:
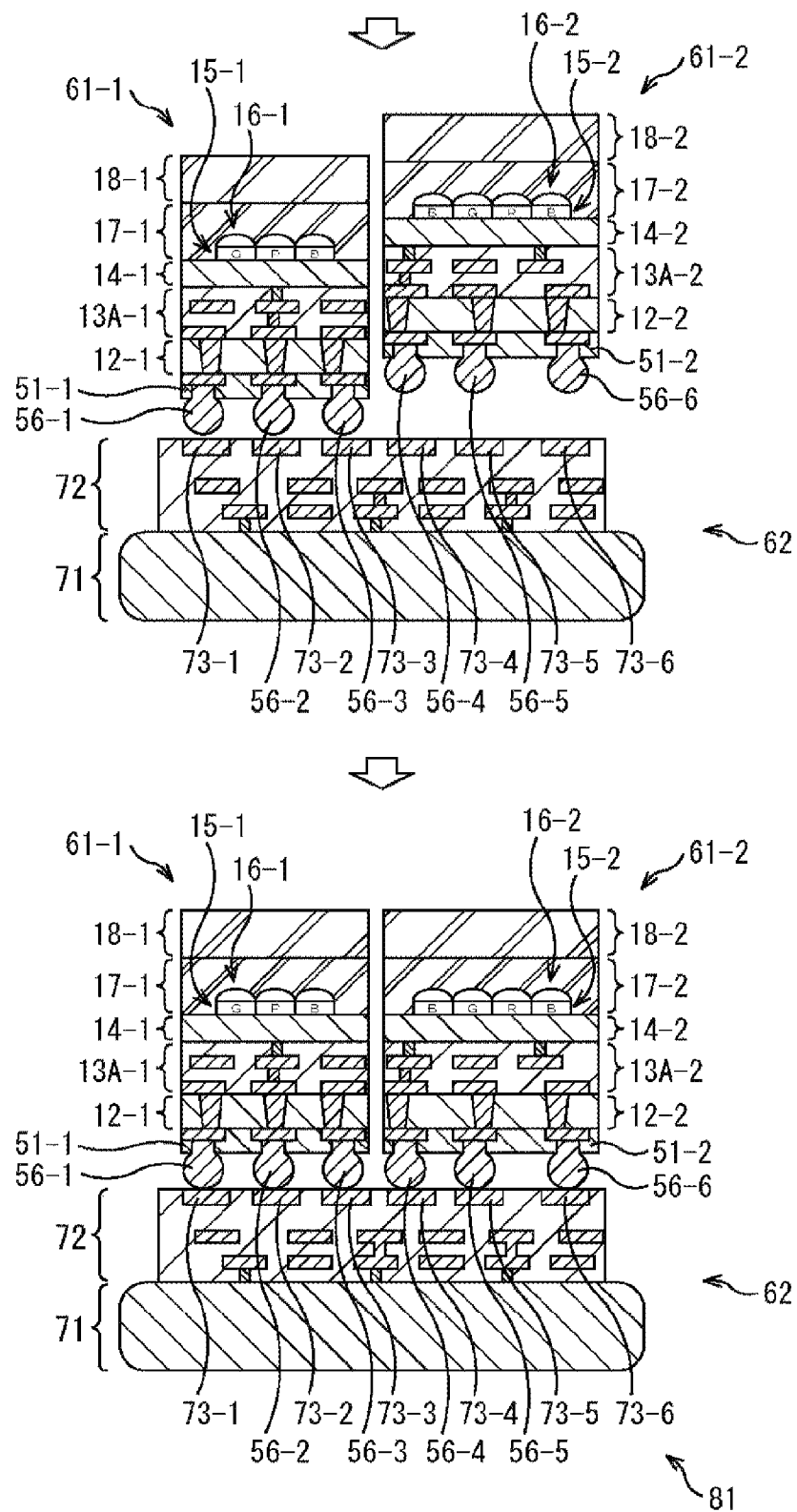
FIG. 28 is a diagram illustrating a seventh configuration example of the imaging device.

Next, as shown in the upper stage of FIG. 28, the chip 61-1 is mounted on the logic circuit board 62. For example, the logic circuit board 62 has a configuration in which a multi-layer wiring layer 72 is laminated on a semiconductor substrate 71 provided with a logic circuit and electrode pads 73-1 to 73-6 are formed on a front surface of the multi-layer wiring layer 72. Then, the chip 61-1 is flip-chip bonded to the electrode pads 73-1 to 73-3 of the logic circuit board 62 by using the solder balls 56-1 to 56-3 to be mounted on the logic circuit board 62, for example.

Then, as shown in the lower stage of FIG. 28, the chip 61-2 is mounted on the logic circuit board 62. For example, the chip 61-2 is flip-chip bonded to the electrode pads 73-4 to 73-6 of the logic circuit board 62 by using the solder balls 56-4 to 56-6 to be mounted on the logic circuit board 62, for example.

Accordingly, a wafer level CSP 81 having a configuration in which the chips 61-1 and 61-2 are mounted on the logic circuit board 62 is manufactured.

Furthermore, as the wafer level CSP 81, for example, a configuration in which the chips 61-1 and 61-2 are mounted on a memory circuit board provided with a memory circuit instead of the logic circuit board 62 may be used. Further, for example, the wafer level CSP may be formed by mounting a logic circuit board, a memory circuit board, or the like smaller than the imaging device 11 on the imaging device 11.

Furthermore, as shown in FIG. 2, when the plurality of electrode pads 24 are arranged in a grid shape, it is possible to easily perform a mounting operation and to further easily perform an underfill injection operation. For this reason, the arrangement pitch of the electrode pads 24 is preferably 0.5 mm or more. Further, in a configuration in which the electrode pad is disposed at a position right above the embedded type through-electrode, it is preferable to use the electrode pad having an area larger than the diameter of the through-electrode. Further, in a configuration using the non-embedded type through-electrode, it is preferable to form the electrode pad on the side of the through-electrode or at the rewiring position.

Further, in the lamination type imaging device 11 in which a logic element or a memory element is provided on the support substrate 12, for example, a method similar to that disclosed in the paragraphs 17 to 30 of Japanese Patent Application Laid-Open No. 2004-335647 can be used. That is, the through-electrode 46 can be formed right below the pixel region 31 by forming an element and then forming the via (for example, a diameter of 2 to 5 μm and a depth of 30 μm) which can be used as a through-electrode and is disposed to face a pixel pad. In this case, it is necessary to dispose the element to be away from the via by several μm so that the through-electrode 46 does not adversely affects the element located on the support substrate 12. Further, the via is formed between formation of the element and formation of the wiring, but the via which can be used as the through-electrode may be formed after forming the wiring layer of the element support substrate.

Further, the electrode pad 26 may not be disposed on a layer closest to the support substrate 12 and may be formed on any wiring layer 21 of the multi-layer wiring layer 13. Further, the electrode pad 26 may be formed so that two or more wirings are laminated. For example, as the electrode pad 26, a combination of an aluminum wiring and a tungsten plug, a combination of an aluminum wiring and a copper wiring, a combination of a copper wiring and a copper wiring, and the like can be used, but the invention is not limited thereto. That is, various combinations can be used.

Further, the through-electrode 46 preferably includes copper having low resistivity and easy connection with the mounting board, but gold (Au), aluminum (Al), tungsten (W), nickel (Ni), tin (Sn), alloys thereof, or the like may be used. Furthermore, in the case of a structure provided with the through-hole 25 or the through-electrode 46, glass may be formed on a pixel array surface with an adhesive interposed therebetween.

Further, in a connection step to the semiconductor substrate 14, a memory circuit, a peripheral circuit element for driving a pixel, or the like may be assembled to the support substrate 12.

Furthermore, the above-described imaging device 11 can be applied to, for example, various electronic apparatuses including an imaging system such as a digital still camera or a digital video camera, a portable device having an imaging function, or other devices having an imaging function.

Configuration Example of Imaging Apparatus

Figure 29:
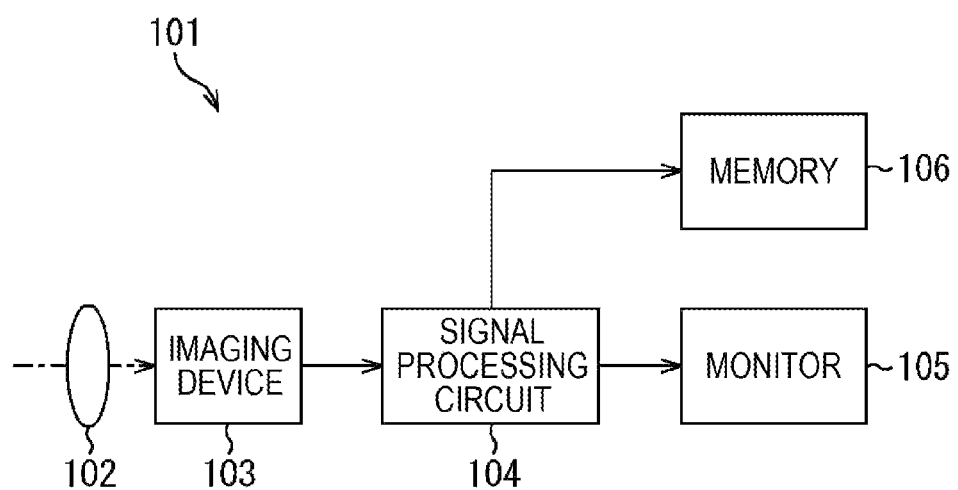
FIG. 29 is a block diagram illustrating a configuration example of an imaging apparatus.

FIG. 29 is a block diagram showing a configuration example of an imaging apparatus mounted on an electronic apparatus.

As shown in FIG. 29, an imaging apparatus 101 includes an optical system 102, an imaging device 103, a signal processing circuit 104, a monitor 105, and a memory 106 and can photograph a still image or a moving image.

The optical system 102 includes one or plural lenses and guides image light (incident light) from a subject to the imaging device 103 to form an image on a light receiving surface (a sensor unit) of the imaging device 103.

As the imaging device 103, the above-described imaging device 11 is applied. Electrons are accumulated in the imaging device 103 for a predetermined period in response to an image formed on the light receiving surface through the optical system 102. Then, a signal in response to the electrons accumulated in the imaging device 103 is supplied to the signal processing circuit 104.

The signal processing circuit 104 performs various signal processes on a pixel signal output from the imaging device 103. An image (image data) obtained by performing a signal process in the signal processing circuit 104 is supplied to the monitor 105 to be displayed thereon or is supplied to the memory 106 to be stored (recorded) therein.

For example, the imaging apparatus 101 with such a configuration can be further decreased in size by applying the above-described imaging device 11.

Usage Example of Image Sensor

Figure 30:
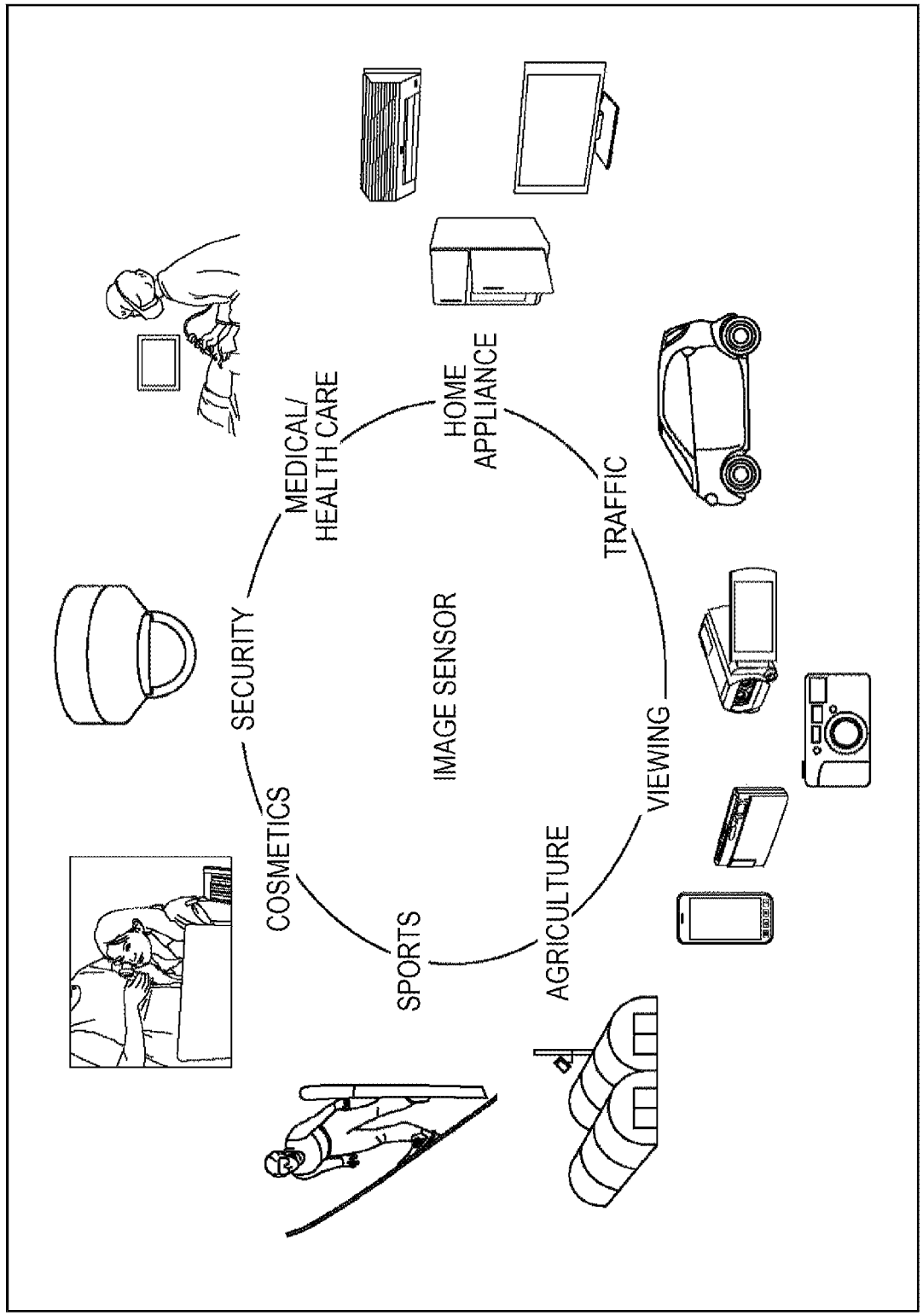
FIG. 30 is a diagram showing a usage example of an image sensor.

FIG. 30 is a diagram showing a usage example of the above-described image sensor.

The above-described image sensor can be used in various cases of sensing light such as visible light, infrared light, ultraviolet light, or X-ray, for example, as follows.

Apparatus for photographing image used for viewing, such as digital camera or portable device with camera function Apparatus used for traffic such as in-vehicle sensor photographing front, rear, periphery, vehicle interior, or the like of vehicle, surveillance camera monitoring traveling vehicle or road, or distance measurement sensor measuring distance between vehicles, for example, for safe driving such as automatic stop, recognition of driver's condition, and the like Apparatus used in home appliances such as TV, refrigerator, and air conditioner to photograph gesture of user and to operate devices according to gesture Apparatus used for medical and health care such as endoscope or apparatus for performing angiography by receiving infrared light Apparatus used for security such as security camera for surveillance or camera for person authentication Apparatus used for cosmetic such as skin measuring instrument for photographing skin or microscope for photographing scalp Apparatus used for sports such as action camera or wearable camera for sports or the like Apparatus used for agriculture such as camera for monitoring conditions of fields and crops Furthermore, the present technology can also have the following configuration.

(1) A solid state imaging device including:

a semiconductor substrate that is provided with a pixel region on which a plurality of pixels is arranged in a planar manner;

a wiring layer that is laminated on the semiconductor substrate and is provided with wiring connected to the plurality of pixels; and a support substrate that is bonded to the wiring layer and supports the semiconductor substrate, in which a plurality of electrode pads used to be electrically connected to an outside is arranged at positions overlapping the pixel region in the wiring layer when the semiconductor substrate is viewed in a planar manner, and through-holes are provided at positions corresponding to the plurality of electrode pads in the support substrate.

(2) The solid state imaging device according to (1), in which the wiring is formed in a multi-layer structure on the wiring layer and an electrode pad layer on which the plurality of electrode pads is arranged is provided on a side of the support substrate in relation to the wiring.

(3) The solid state imaging device according to (1) or (2), in which the electrode pad includes a conductor different from that of the wiring.

(4) The solid state imaging device according to (1), in which the electrode pad is formed on the same layer as that of the wiring as a part of the wiring formed in a multi-layer structure on the wiring layer.

(5) The solid state imaging device according to (1) or (4)

in which the electrode pad includes the same conductor as that of the wiring.

(6) The solid state imaging device according to any of (1) to (5), further including:

a through-electrode that is electrically connected to the electrode pad at a bottom surface of the through-hole and extends to an upper surface of the support substrate through the through-hole.

(7) The solid state imaging device according to (6), in which the through-electrode is formed by burying the through-hole with a conductor.

(8) The solid state imaging device according to any of (1) to (7), in which the support substrate in which a conductor corresponding to a through-electrode is buried in the through-hole through an insulation film in advance is bonded to the wiring layer while facing each other and the through-electrode and the electrode pad are bonded to each other by the same conductor.

(9) The solid state imaging device according to (8), in which the through-electrode is formed by burying the conductor in a via formed to such a depth that the via does not penetrate the support substrate and thinning the support substrate to project a head of the conductor.

(10) The solid state imaging device according to (8) or (9), in which the electrode pads are arranged on a front surface of the support substrate to correspond to the through-electrodes.

(11) The solid state imaging device according to any of (1) to (10), in which the solid state imaging device is flip-chip bonded to other substrates by using a solder ball formed on a front surface of the support substrate to be electrically connected to the electrode pad.

(12) The solid state imaging device according to any of (1) to (11), in which a through-electrode penetrating the support substrate and connected to the electrode pad is formed and then a color filter layer is laminated on the semiconductor substrate.

(13) The solid state imaging device according to any of (1) to (12), in which the plurality of electrode pads is arranged in a grid shape when the semiconductor substrate is viewed in s planar manner.

(14) The solid state imaging device according to any of (1) to (12), in which the solid state imaging device is of a back side irradiation type in which light received by the pixel is irradiated from a back surface side of the semiconductor substrate.

(15) A method of manufacturing a solid state imaging device including a semiconductor substrate that is provided with a pixel region on which a plurality of pixels is arranged in a planar manner, a wiring layer that is laminated on the semiconductor substrate and is provided with wiring connected to the plurality of pixels, and a support substrate that is bonded to the wiring layer and supports the semiconductor substrate, the method including steps of:

forming a plurality of electrode pads used to be electrically connected to an outside at positions overlapping the pixel region in the wiring layer when the semiconductor substrate is viewed in a planar manner; and forming through-holes at positions corresponding to the plurality of electrode pads in the support substrate.

(16) An electronic apparatus including:

a solid state imaging device including:

a semiconductor substrate that is provided with a pixel region on which a plurality of pixels is arranged in a planar manner;

a wiring layer that is laminated on the semiconductor substrate and is provided with wiring connected to the plurality of pixels; and a support substrate that is bonded to the wiring layer and supports the semiconductor substrate, in which a plurality of electrode pads used to be electrically connected to an outside is arranged at positions overlapping the pixel region in the wiring layer when the semiconductor substrate is viewed in a planar manner, and through-holes are provided at positions corresponding to the plurality of electrode pads in the support substrate.

Furthermore, the embodiment is not limited to the above-described embodiment and can be modified into various forms without departing from the spirit of the present disclosure.

REFERENCE SIGNS LIST

11 Imaging device
12 Support substrate
13 Multi-layer wiring layer
14 Semiconductor substrate
15 Color filter layer
16 On-chip lens layer
17 Glass sealing resin layer
18 Glass protective substrate
21-1 First wiring layer
21-2 Second wiring layer
22 Electrode pad layer
23 Interlayer insulation film
24 Electrode pad
25 Through-hole
26 Electrode pad 2
31 Pixel region
32 Optical black region
33 Resist pattern
34 Photosensitive solder resist
35 Solder ball
41 Insulation film
42 Through-electrode
43 Seed layer
44 Plating layer
45 Embedded type through-electrode
46 Through-electrode
47 Non-penetration via
51 Insulation film
52 Buried electrode pad
53 Insulation film
54 Temporary substrate
55 Electrode pad
56 Solder ball
57 Silicon oxide film
61 Chip
62 Logic circuit board
71 Semiconductor substrate
72 Multi-layer wiring layer
73 Electrode pad
81 Wafer level CSP

What is claimed is:

1. A solid state imaging device, comprising:
a semiconductor substrate that is provided with a pixel region on which a plurality of pixels is arranged in a planar manner;
a wiring layer that is laminated on the semiconductor substrate and is provided with a plurality of wirings connected to the plurality of pixels;
a support substrate that is bonded to the wiring layer and supports the semiconductor substrate,
wherein a plurality of electrode pads used to be electrically connected to an outside is arranged at positions overlapping the pixel region in the wiring layer when the semiconductor substrate is viewed in the planar manner;
a plurality of through-holes that are provided at positions corresponding to selected electrode pads of the plurality of electrode pads in the support substrate;
a through-electrode that is electrically and physically connected to a corresponding selected electrode pad at a bottom surface of a corresponding through-hole of the plurality of through-holes,
wherein the plurality of through-holes are each constantly tapered from an upper surface of the support substrate through a lower surface of the support substrate into the wiring layer such that openings of each of the plurality of through-holes at the upper surface of the support substrate are larger than openings of each of the plurality of through-holes at the lower surface of the support substrate; and
an insulation film formed on side surfaces of the plurality of through-holes extending into the wiring layer and on an entire surface of the upper surface of the support substrate except for where the plurality of through-holes exists.

2. The solid state imaging device according to claim 1, wherein the plurality of wirings is formed in a multi-layer structure on the wiring layer and an electrode pad layer on which the plurality of electrode pads is arranged is provided on a side of the support substrate in relation to the plurality of wirings.

3. The solid state imaging device according to claim 2, wherein each of the plurality of electrode pads includes a conductor different from that of each of the plurality of wirings.

4. The solid state imaging device according to claim 1, wherein each of the plurality of electrode pads is formed on a same layer as that of one layer of a multi-layer structure on the wiring layer.

5. The solid state imaging device according to claim 4, wherein each of the plurality of electrode pads includes a same conductor as that of each of the plurality of wirings.

6. The solid state imaging device according to claim 1, wherein the through-electrode is formed by burying the through-hole with a conductor.

7. The solid state imaging device according to claim 1, wherein the support substrate in which a conductor corresponding to a through-electrode is buried in the through-hole through an insulation film in advance is bonded to the wiring layer while facing each other and the through-electrode and the electrode pad are bonded to each other by a same conductor.

8. The solid state imaging device according to claim 7, wherein the through-electrode is formed by burying the conductor in a via formed to such a depth that the via does not penetrate the support substrate and thinning the support substrate to project a head of the conductor.

9. The solid state imaging device according to claim 7, wherein the electrode pads are arranged on a front surface of the support substrate to correspond to the through-electrodes.

10. The solid state imaging device according to claim 1, wherein the solid state imaging device is flip-chip bonded to other substrates by using a solder ball formed on a front surface of the support substrate to be electrically connected to the electrode pad.

11. The solid state imaging device according to claim 1, wherein a through-electrode penetrating the support substrate and connected to the electrode pad is formed and then a color filter layer is laminated on the semiconductor substrate.

12. The solid state imaging device according to claim 1, wherein the plurality of electrode pads is arranged in a grid shape when the semiconductor substrate is viewed in the planar manner.

13. The solid state imaging device according to claim 1, wherein the solid state imaging device is of a back side irradiation type in which light received by the pixel is irradiated from a back surface side of the semiconductor substrate.

14. The solid state imaging device according to claim 1, wherein each of the plurality of through-holes is provided within the pixel region.

15. A method of manufacturing a solid state imaging device including a semiconductor substrate that is provided with a pixel region on which a plurality of pixels is arranged in a planar manner, a wiring layer that is laminated on the semiconductor substrate and is provided with a plurality of wirings connected to the plurality of pixels, and a support substrate that is bonded to the wiring layer and supports the semiconductor substrate, the method comprising steps of:
forming a plurality of electrode pads used to be electrically connected to an outside at positions overlapping the pixel region in the wiring layer when the semiconductor substrate is viewed in the planar manner;
forming a plurality of through-holes at positions corresponding to selected electrode pads of the plurality of electrode pads in the support substrate;
forming a through-electrode that is electrically and physically connected to a corresponding selected electrode pad at a bottom surface of a corresponding through-hole of the plurality of through-holes,
wherein the plurality of through-holes are each constantly tapered from an upper surface of the support substrate through a lower surface of the support substrate into the wiring layer such that openings of each of the plurality of through-holes at the upper surface of the support substrate are larger than openings of each of the plurality of through-holes at the lower surface of the support substrate; and
forming an insulation film on side surfaces of the plurality of through-holes extending into the wiring layer and on an entire surface of the upper surface of the support substrate except for where the plurality of through-holes exists.

16. The method of manufacturing a solid state imaging device according to claim 15, wherein each of the plurality of through-holes is provided within the pixel region.

17. An electronic apparatus, comprising:
a solid state imaging device including:
a semiconductor substrate that is provided with a pixel region on which a plurality of pixels is arranged in a planar manner;
a wiring layer that is laminated on the semiconductor substrate and is provided with a plurality of wirings connected to the plurality of pixels;
a support substrate that is bonded to the wiring layer and supports the semiconductor substrate,
wherein a plurality of electrode pads used to be electrically connected to an outside is arranged at positions overlapping the pixel region in the wiring layer when the semiconductor substrate is viewed in the planar manner;
a plurality of through-holes that are provided at positions corresponding to selected electrode pads of the plurality of electrode pads in the support substrate;
a through-electrode that is electrically and physically connected to a corresponding selected electrode pad at a bottom surface of a corresponding through-hole of the plurality of through-holes,
wherein the through-holes are constantly tapered from an upper surface of the support substrate through a lower surface of the support substrate into the wiring layer such that openings of the through-holes at the upper surface of the support substrate are larger than openings of the through-holes at the lower surface of the support substrate; and
an insulation film formed on side surfaces of the plurality of through-holes extending into the wiring layer and on an entire surface of the upper surface of the support substrate except for where the plurality of through-holes exists.

18. The electronic apparatus according to claim 17, wherein the through-electrode is formed by burying the through-hole with a conductor.

19. The electronic apparatus according to claim 17, wherein each of the plurality of through-holes is provided within the pixel region.

* * * * *